US012645009B2

(12) United States Patent
Albahrani et al.

(10) Patent No.: US 12,645,009 B2
(45) Date of Patent: Jun. 2, 2026

(54) INTEGRATION OF A FINITE ELEMENT GEOMECHANICS MODEL AND CUTTINGS RETURN IMAGE PROCESSING TECHNIQUES

(71) Applicant: SAUDI ARABIAN OIL COMPANY, Dhahran (SA)

(72) Inventors: Hussain Albahrani, Qatif (SA); Arturo Magana-Mora, Dhahran (SA); Mohammad Aljubran, Sayhat (SA); Chinthaka Pasan Gooneratne, Dhahran (SA)

(73) Assignee: SAUDI ARABIAN OIL COMPANY, Dhahran (SA)

( * ) Notice: Subject to any disclaimer, the term of this patent is extended or adjusted under 35 U.S.C. 154(b) by 1204 days.

(21) Appl. No.: 17/644,360

(22) Filed: Dec. 15, 2021

(65) Prior Publication Data

US 2023/0184992 A1      Jun. 15, 2023

(51) Int. Cl.
*G06F 30/23*       (2020.01)
*E21B 21/06*       (2006.01)
(Continued)

(52) U.S. Cl.
CPC ............ *G01V 20/00* (2024.01); *E21B 21/065* (2013.01); *E21B 49/005* (2013.01);
(Continued)

(58) Field of Classification Search
CPC ......... G01V 20/00; G06T 7/10; G06T 7/0004; G06T 7/20; G06T 2207/10016; G06T 2207/20081; G06T 2207/30108; G06F 30/23; G06F 18/40; G06F 18/214; G06V 10/764; E21B 21/065; E21B 49/005
See application file for complete search history.

(56) References Cited

U.S. PATENT DOCUMENTS 7,908,034 B2    3/2011   Gray
9,328,573 B2    5/2016   Standifird et al.
(Continued)

FOREIGN PATENT DOCUMENTS

WO          82/02573 A1    8/1982
WO      2016/077521 A1    5/2016
WO      2019/117857 A1    6/2019

OTHER PUBLICATIONS

Guilherme et al.; "Petroleum well drilling monitoring through cutting image analysis and artificial intelligence techniques;" Elsevier, Science Direct; vol. 24; Issue 1; Feb. 2011; pp. 201-207 (7 pages).
(Continued)

*Primary Examiner* — Kibrom K Gebresilassie
(74) *Attorney, Agent, or Firm* — Osha Bergman Watanabe & Burton LLP

(57)          ABSTRACT

A method includes taking at least one image of a plurality of returned rock fragments from a wellbore using a camera, analyzing the at least one image with an image analysis program to detect a caving in the plurality of returned rock fragments, constructing a model of the caving, and incorporating the model of the caving into a finite element geomechanics model of the wellbore using a meshing program to create an adjusted model of the wellbore.

19 Claims, 13 Drawing Sheets

(51) Int. Cl.

| | |
|---|---|
| *E21B 49/00* | (2006.01) |
| *G01V 20/00* | (2024.01) |
| *G06F 18/214* | (2023.01) |
| *G06F 18/40* | (2023.01) |
| *G06T 7/00* | (2017.01) |
| *G06T 7/10* | (2017.01) |
| *G06T 7/20* | (2017.01) |
| *G06T 7/70* | (2017.01) |
| *G06V 10/764* | (2022.01) |

(52) U.S. Cl.
CPC ............ *G06F 18/214* (2023.01); *G06F 18/40* (2023.01); *G06F 30/23* (2020.01); *G06T 7/0004* (2013.01); *G06T 7/10* (2017.01); *G06T 7/20* (2013.01); *G06T 7/70* (2017.01); *G06V 10/764* (2022.01); *G06T 2207/10016* (2013.01); *G06T 2207/20081* (2013.01); *G06T 2207/30108* (2013.01)

(56) References Cited

U.S. PATENT DOCUMENTS

| | | | |
|---|---|---|---|
| 9,372,162 | B2 | 6/2016 | Ganz |
| 9,507,047 | B1 | 11/2016 | Dvorkin et al. |
| 9,810,062 | B2 | 11/2017 | Akkurt et al. |
| 10,796,424 | B2 | 10/2020 | Parmeshwar et al. |
| 10,816,440 | B2 | 10/2020 | Amendt et al. |
| 2010/0204825 | A1* | 8/2010 | Morrison .............. G01N 33/24 700/223 |
| 2011/0077918 | A1* | 3/2011 | Mutlu ..................... G01V 9/00 703/2 |
| 2011/0303460 | A1* | 12/2011 | Rudolf Von Rohr ..... E21B 7/14 175/14 |
| 2012/0181221 | A1* | 7/2012 | Djordjevic ............. G01N 33/24 374/45 |
| 2014/0333754 | A1 | 11/2014 | Graves et al. |
| 2021/0293122 | A1* | 9/2021 | Dumont ................. E21B 43/34 |

OTHER PUBLICATIONS

H. I. H. Albahrani, "An Automated Drilling Geomechanics Simulator Using Machine-Learning Assisted Elasto-Plastic Finite Element Model", Texas A&M University, Dec. 2020 (271 pages).

P. Iastrebov, "Conceptual Design of Drilling Cuttings Analysis System Based on Machine Learning Techniques", Montanuniversität, Jul. 2020 (121 pages).

First Examination Report issued in Saudi Arabian Application No. 122440854, dated Apr. 23, 2024 (9 pages).

\* cited by examiner

130

400

$$O_1 = \{length,\ S_1, S_2, S_3, ..., S_n\}$$

$$O_2 = \{length,\ S_1, S_2, S_3, S_4, 0, ..., 0\}$$

INTEGRATION OF A FINITE ELEMENT GEOMECHANICS MODEL AND CUTTINGS RETURN IMAGE PROCESSING TECHNIQUES

BACKGROUND

Drilling fluid, also referred to as "drilling mud" or simply "mud," is used to facilitate drilling boreholes into the earth, such as drilling oil and natural gas wells. Using one or more mud pumps, drilling fluid may be circulated through a well system. As the drilling fluid is circulated, the drilling fluid may flow from the surface of a well, through a drill string, out the end of the drill string, and back up the well through an annulus formed around the outside of the drill string to return to the surface of the well. As the drilling fluid exits the drill string and returns to the surface, cuttings from the formation may be carried with the drilling fluid to the surface. In many well systems, a series of different equipment may be positioned along the drilling fluid flow path (e.g., inside the drill string and outside the drill string), which may be used to regulate or monitor the flow of the drilling fluid and monitor the drilling progress. For example, measurement-while-drilling (MWD) tools (e.g., tools capable of evaluating physical properties such as pressure, temperature, formation parameters, etc.), mud logging tools (e.g., tools used to create a well log of a borehole by examining the rock cuttings brought to the surface by the circulating drilling mud), cutting analysis tools, and sensors may be used to monitor the progress of drilling a well.

Some analysis procedures have been developed to monitor the well drilling progress include analyzing the returned cuttings. For example, returned cuttings may be analyzed to determine the rock type, which may indicate the type of formation being drilled, and to determine the amount of cuttings being returned, which may indicate drilling performance.

SUMMARY

This summary is provided to introduce a selection of concepts that are further described below in the detailed description. This summary is not intended to identify key or essential features of the claimed subject matter, nor is it intended to be used as an aid in limiting the scope of the claimed subject matter.

In one aspect, embodiments disclosed herein relate to methods that include taking at least one image of a plurality of returned rock fragments from a wellbore using a camera, analyzing the at least one image with an image analysis program to detect a caving in the plurality of returned rock fragments, constructing a model of the caving, and incorporating the model of the caving into a finite element geomechanics model of the wellbore using a meshing program to create an adjusted model of the wellbore.

In another aspect, embodiments disclosed herein relate to methods that include directing drilling fluid returning from a wellbore to a separator, separating rock fragments from the drilling fluid in the separator, continuously taking images of the rock fragments separated from the drilling fluid, sending the images to a computing system, identifying and characterizing at least one caving from the images using an image analysis program, using characteristics of the at least one caving identified from the image analysis program to construct a finite element geomechanics model of the wellbore, and adjusting at least one drilling parameter based on the finite element geomechanics model of the wellbore.

In yet another aspect, embodiments disclosed herein relate to systems that include a well system with a wellbore extending into a formation, a cuttings return system having a separator fluidly connected to a return line from the wellbore and a camera positioned proximate the separator, and a computing system in communication with the camera. The computing system may include an image analysis program having instructions for identifying a caving from an image produced by the camera, a finite element geomechanics model program having instructions for generating a finite element geomechanics model of the wellbore, and a meshing program having instructions to derive at least one dimension of the caving from the image and remove the at least one dimension of the caving from the finite element geomechanics model of the wellbore to create an adjusted model of the wellbore.

Other aspects and advantages will be apparent from the following description and the appended claims.

BRIEF DESCRIPTION OF DRAWINGS

Wherever possible, like or identical reference numerals are used in the figures to identify common or the same elements. The figures are not necessarily to scale and certain features and certain views of the figures may be shown exaggerated in scale for purposes of clarification.

DETAILED DESCRIPTION

Embodiments of the present disclosure are described below in detail with reference to the accompanying figures. In the following detailed description, numerous specific details are set forth in order to provide a more thorough understanding of the claimed subject matter. However, it will be apparent to one having ordinary skill in the art that the embodiments described may be practiced without these specific details. In other instances, well-known features have not been described in detail to avoid unnecessarily complicating the description.

Embodiments disclosed herein generally may describe systems and methods of integrating cuttings image analysis with a finite element geomechanics model of a wellbore, which may be used to assess wellbore strength. The disclosed integration of cuttings image analysis with a finite element geomechanics model may also be used to aid in the development of optimized drilling parameters to reduce the probability of caving in the wellbore sections to be drilled ahead, as well as in wellbores to be drilled in the same field. Systems and methods disclosed herein may generally be applied to a well drilling operation, which may take place onshore or offshore.

Figure 1:
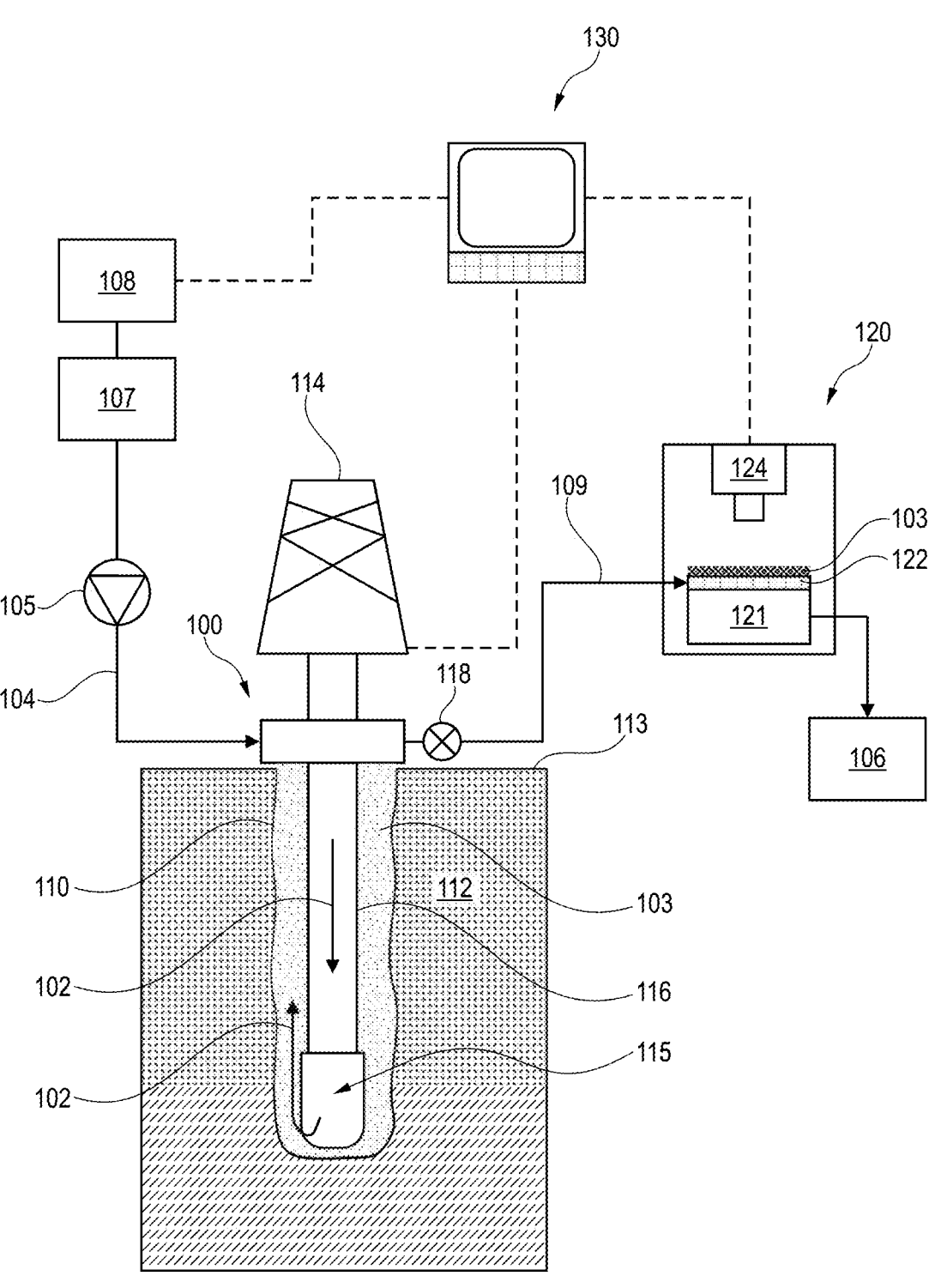
FIG. 1 shows a system according to embodiments of the present disclosure.

FIG. 1 shows an example of a well drilling operation that may incorporate systems and methods according to embodiments of the present disclosure. During the drilling process to form a well 100, a wellbore 110 may be drilled through a subsurface formation ("formation") 112, which may include different layers of rock having varying characteristics, such as varying degrees of permeability, porosity, capillary pressure, and resistivity.

To drill the wellbore 110, a drill bit 115 (or other cutting tool) connected to a drill string 116 may be rotated using equipment at a rig 114 to cut through the formation 112. During drilling, drilling fluid 102 may be pumped using one or more mud pumps 105 from one or more drilling fluid sources 107 (e.g., a mud tank, a mud truck, etc.) via flow lines 104 to the wellbore 110 to aid with drilling, e.g., by providing hydrostatic pressure to the wellbore 110, keeping the cutting tool cool during drilling, and clearing away cuttings as they are cut from the formation 112. The drilling fluid 102 may be designed to provide a selected amount of weight downhole in order to maintain a range of hydrostatic pressure in the wellbore 110. Hydrostatic pressure (calculated from mud weight and the true vertical depth of the wellbore 110) may be maintained within predetermined drilling window limits in order to keep enough pressure downhole to prevent an influx of fluids from downhole and to avoid excessive pressure that could result in hydraulic fractures in the formation and lost circulation. One or more drilling fluid additives may be added to the drilling fluid 102 to provide the drilling fluid 102 with a selected drilling fluid weight (also referred to as mud weight). Examples of drilling fluid additives may include, but are not limited to, bentonite, sodium bentonite, and other clay-based compounds, cellulosic fibers, mineral fibers, viscosifiers, lost circulation material, polymers, polymer-based compounds, and weighting agents, such as barite, hematite, ilmenite, barite-manganese tetroxide (e.g., Micromax), calcium carbonate, and siderite. Drilling fluid additives may be added to the drilling fluid 102 from one or more additive tanks 108, which may be fluidly connected to the drilling fluid source 107 or the flow lines 104 carrying the drilling fluid 102 to the wellbore 110.

As the drill bit 115 drills into the formation 112 to create the wellbore 110, broken rock fragments 103 from the formation may be transported to the surface of the well 100 using drilling fluid 102 circulating through the well 100. Additionally, as the wellbore 110 is drilled through the formation 112, portions of the well may be cased with a casing (extending from the surface of the well) or a liner (extending downhole from an end of a previously installed casing or liner) to line the well wall. The terms "open hole,"

"borehole," and "wellbore" may be used interchangeably and refer to an uncased portion of a well.

When the drilling fluid 102 and rock fragments 103 are circulated to the surface of the well 100 during a drilling operation, the returned drilling fluid may be directed via one or more conduits (e.g., piping, manifolds, flow paths through a wellhead, etc.) including a return line 109 to a cuttings return system 120. The cuttings return system 120 may include one or more separators 121 (sometimes referred to in the industry as shakers) fluidly connected to a return line 109 from the well 100 and at least one camera 124 positioned proximate the separator(s) 121. Separators 121 include equipment used to filter out solids, e.g., rock fragments 103, from the drilling fluid 102, so the drilling fluid 102 can be circulated back into the wellbore to be reused and/or stored in a mud container 106. The rock fragments 103 filtered or separated by separators 121 may mainly, but not exclusively, be either cuttings, which are produced by the crushing or scrapping action of the drill bit at the bottom of the wellbore 110, or rock cavings, which may be produced from the sides or walls of the wellbore due to wellbore instability.

A separator 121 may include, for example, one or more screens 122 arranged in the flow path of the returned drilling fluid to catch and separate rock fragments 103 from the drilling fluid 102. For example, a separator 121 may have a screen 122 positioned laterally at an upper end of the separator 121, where returned drilling fluid may be flowed over the screen 122 after returning from the well 100. As the returned drilling fluid 102 is flowed over the screen 122, rock fragments 103 in the returned drilling fluid 102 may be caught by the screen 122, while the drilling fluid 102 flows through the screen openings. In such manner, rock fragments 103 brought up from drilling the well 100 may be captured and held by a screen 122 in a separator 121. In some embodiments, more than one screen and/or more than one separator may be used to separate rock fragments from returned drilling fluid. In some embodiments, one or more conveyors may convey screens and/or rock fragments along a path, e.g., to move rock fragments to a different location for imaging and analysis. Other types of separators, or shakers, may be used to separate rock fragments 103 from drilling fluid 102.

A cuttings return system 120 may also include a camera 124, which may be held in a position to take images of the drilling fluid 102 and any returned rock fragments 103 as they are returned from the well 100. In some embodiments, the camera 124 may be positioned above the separator 121 and positioned to take pictures of the rock fragments 103 when they are separated from the drilling fluid 102 by the separator 121. For example, as shown in FIG. 1, a camera 124 may be held a distance above the top screen 122 of a separator 121 and positioned to face the screen 122. In some embodiments, one or more conveyors may be used to convey the captured rock fragments 103 a distance from the separator 121 to a separate detection system having at least one camera 124 to take images of the collected rock fragments 103.

Figure 2:
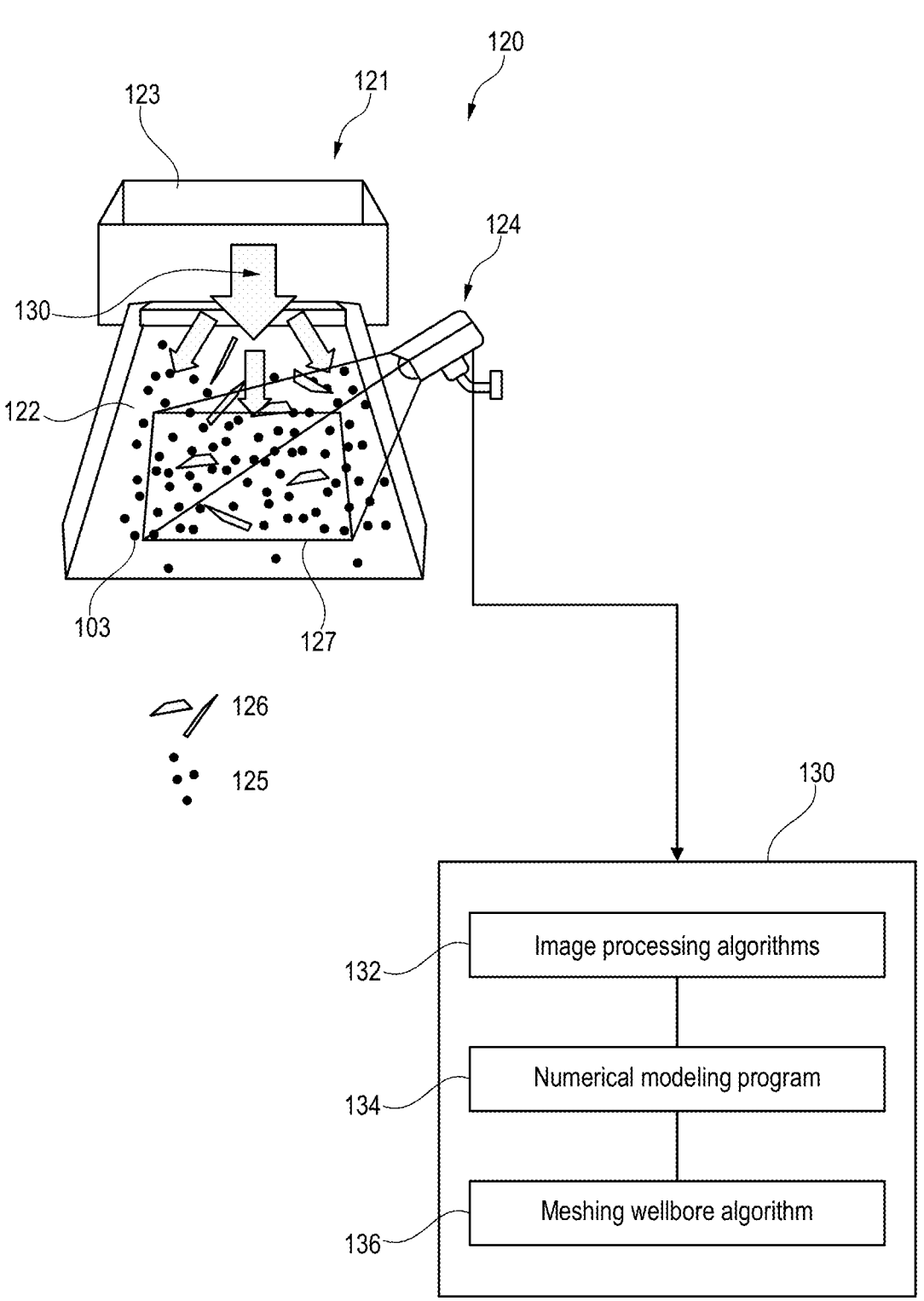
FIG. 2 shows part of the system shown in FIG. 1.

FIG. 2 shows another view of a cuttings return system 120, where returning drilling fluid 102 may be flowed into a header box 123 portion of a separator 121. The drilling fluid 102 may then be flowed over a screen 122 held by a separator frame to catch rock fragments 103 flowing with the drilling fluid 102. The rock fragments 103 may include cuttings 125 and cavings 126 returned from the wellbore 110. A camera 124 may be positioned above the screen 122 in a position that allows the camera 124 to take pictures of the rock fragments 103 collected by the screen 122. For example, in some embodiments, the camera 124 may be mounted on a swing arm attached to a non-vibrating or static frame of the separator 121, a nearby rig structure, or a mast directly located in front of the separator 121. The camera 124 may take one or more images of the rock fragments 103 held on the screen 122 within the frame 127 (i.e., the area within the camera's field of view, which is captured in images taken by the camera) of the camera 124. In some embodiments, the rock fragments 103 may be moved across the frame 127 of the camera 124, where the camera 124 may take multiple images of the rock fragments 103 as they are moved across the frame 127.

Other types of image capturing devices may be used in addition to or in the alternative to a camera 124, such as any other image or vision sensor, including infrared, gamma ray, CT scan, x-ray, among others, for image/video capture.

Depending on the return fluid flow rate of the drilling fluid 102 and amount of rock fragments being returned in a drilling operation, separated and captured rock fragments may be moved through the separator 121 relatively quickly to allow for a continuous separation operation. To aid in a continuous separation operation, the camera 124 may be controlled to take images of the rock fragments 103 at a rate commensurate with the speed of rock fragment separation and removal. The camera 124 may be controlled by a timer and/or using a software program to take images at a selected interval. For example, a camera 124 may be controlled to take a picture at a timed interval, e.g., every 5 minutes, every 10 minutes, or other time, or at an interval that is tied to a cutting conveyance rate of rock fragments 103 being moved along the separator 121 or to a flow rate of returning drilling fluid measured along a flow path between the well 100 and the separator 121.

In some embodiments, the camera 124 may be timed to take multiple images of rock fragments 103 as they move across the frame 127 of the camera 124. In such embodiments, a stack of consecutively taken images may be used to capture different views of the rock fragments 103 at different angles as they move across the frame of the camera 124. The different views, from different angles, of the rock fragments 103 may be used to identify the types of rock fragments 103 (e.g., cuttings or cavings) and determine different characteristics of the rock fragments 103, such as size, shape, rock type, failure mode (e.g., fracture), etc., for example, by considering the centroid distances between the rock fragments and the camera or by using image registration techniques, along with interpolation techniques.

Figure 3A:
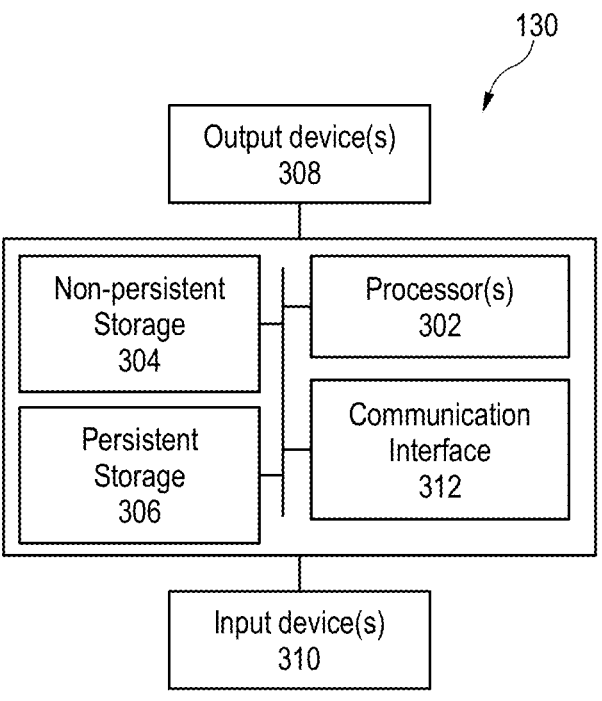
FIGS. 3A-3B show a computing system in accordance with one or more embodiments.

Images taken by the camera 124 may be sent to a computing system 130, which may be located anywhere at the drilling site or in a cloud infrastructure. Any combination of mobile, desktop, server, router, switch, embedded device, or other types of hardware may be used for the computing system 130. For example, as shown in FIG. 3A, the computing system 130 may include one or more computer processors 302, non-persistent storage 304 (e.g., volatile memory, such as random access memory (RAM), cache memory), persistent storage 306 (e.g., a hard disk, an optical drive such as a compact disk (CD) drive or digital versatile disk (DVD) drive, a flash memory, etc.), a communication interface 312 (e.g., Bluetooth interface, infrared interface, network interface, optical interface, etc.), and numerous other elements and functionalities.

The computer processor(s) 302 may be an integrated circuit for processing instructions. For example, the computer processor(s) may be one or more cores or micro-cores of a processor. The computing system 130 may also include one or more input devices 310, such as a touchscreen, keyboard, mouse, microphone, touchpad, electronic pen, or any other type of input device.

The communication interface 312 may include an integrated circuit for connecting the computing system 130 to a network (not shown) (e.g., a local area network (LAN), a wide area network (WAN) such as the Internet, mobile network, or any other type of network) and/or to another device, such as another computing device.

Further, the computing system 130 may include one or more output devices 308, such as a screen (e.g., a liquid crystal display (LCD), a plasma display, touchscreen, cathode ray tube (CRT) monitor, projector, or other display device), a printer, external storage, or any other output device. One or more of the output devices may be the same or different from the input device(s). The input and output device(s) may be locally or remotely connected to the computer processor(s) 302, non-persistent storage 304, and persistent storage 306. Many different types of computing systems exist, and the aforementioned input and output device(s) may take other forms.

Figure 3B:
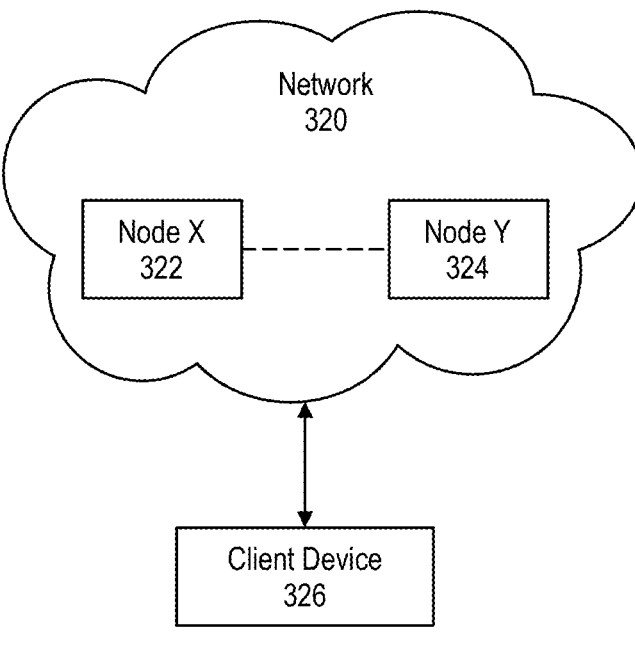

The computing system 130 may be connected to or be a part of a network. For example, as shown in FIG. 3B, the network 320 may include multiple nodes (e.g., node X 322, node Y 324). Each node may correspond to a computing system, such as the computing system shown in FIG. 3A, or a group of nodes combined may correspond to the computing system shown in FIG. 3A. By way of an example, embodiments of the disclosure may be implemented on a node of a distributed system that is connected to other nodes. By way of another example, embodiments of the disclosure may be implemented on a distributed computing system having multiple nodes, where each portion of the disclosure may be located on a different node within the distributed computing system. Further, one or more elements of the aforementioned computing system 130 may be located at a remote location and connected to the other elements over a network.

The nodes (for example, node X 322, node Y 324) in the network 320 may be configured to provide services for a client device 326. For example, the nodes may be part of a cloud computing system. The nodes may include functionality to receive requests from the client device 326 and transmit responses to the client device 326. The client device 326 may be a computing system, such as the computing system shown in FIG. 3A. Further, the client device 326 may include or perform all or a portion of one or more embodiments of the disclosure.

Software instructions in the form of computer readable program code to perform embodiments of the disclosure may be stored, in whole or in part, temporarily or permanently, on a non-transitory computer readable medium such as a CD, DVD, storage device, a diskette, a tape, flash memory, physical memory, or any other computer readable storage medium. Specifically, the software instructions may correspond to computer readable program code that, when executed by a processor(s), is configured to perform one or more embodiments of the disclosure. For example, the computing system 130 may include software programs to perform methods disclosed herein, including image analysis and integration of the image analysis with a numerical model of a wellbore.

For example, as shown in FIG. 2, a computing system 130 may include multiple software modules, including an image analysis module having image processing algorithms 132 for image analysis of images taken by the camera 124, a numerical modeling module having at least one program 134 for providing a numerical model of the wellbore 110, and a meshing module having at least one meshing wellbore algorithm 136 for integrating the image analysis with the numerical model of the wellbore. Each of the image analysis module, the numerical modeling module, and the meshing module are described in more detail below.

Numerical Modeling Module

The computing system 130 may include a series of computing programs that may be used to process drilling system data and integrate received data with a model of the wellbore 110 through a numerical model, which may be generated using a finite element method, a finite difference method, or any other similar numerical method according to embodiments of the present disclosure. Generally, a numerical method, such as finite element analysis ("FEA"), may be used to numerically simulate the wellbore 110. Modeled parameters of the formation 112 around the wellbore 110 may be inputted from various sources (e.g., selected formation properties may be characterized in the lab to provide an accurate description of the behavior of the selected formation), where a numerical representation of the selected formation may then be developed based on solid mechanics principles from the inputted formation material characteristics. The numerical model may be defined by the number, size, and material properties of discrete regions in the modeled formation around the wellbore 110. Methods for generating numerical models are described herein as using a finite element geomechanics model ("FEM"). However, other numerical models may be similarly implemented.

According to embodiments of the present disclosure, wellbore geometry and strength may be assessed using a numerical model, such as an FEM of the wellbore. By using numerical modeling for a wellbore being drilled, the wellbore model may be continuously updated during drilling, which may allow for a more accurate representation of the wellbore as it progresses in real time or near real time. By more accurately modeling the wellbore, a more accurate drilling plan may be determined to reduce drilling inefficiencies. For example, an accurately assessed and modeled wellbore may be used to more accurately determine the required supporting load from the drilling fluid hydrostatic pressure to prevent influx of fluids from the formation, prevent unwanted fracturing of the formation, and prevent portions of the wellbore wall from collapsing.

An FEM of the wellbore may be generated for use in FEA of the wellbore performance in response to external loads (e.g., forces from drilling fluid circulating therethrough). To create the FEM, the wellbore may be broken down into many small pieces, i.e., a finite number of elemental units, of various types, sizes and shapes. This may be achieved using a selected discretization in the space dimensions, which is implemented by constructing an initial mesh of the wellbore (made of a mesh of simultaneous equations). The elemental units may be assumed to have a simplified pattern of deformation (e.g., linear, quadratic, etc.) and are connected at "nodes," which may be located at corners or edges of the elemental units. The equations that model the elemental units may be assembled into a larger system of equations that models the wellbore to form the FEM.

According to embodiments of the present disclosure, an FEM module used in forming an FEM model of a wellbore may include FEM code (which may be held as software instructions stored on and/or running on one or more components in the computing system 130) that includes instructions for forming a three-dimensional poro-elasto-plastic finite element model for solids and geomechanics. A poro-elasto-plastic finite element model refers to a numerical model that estimates deformations in a porous solid body, such as rocks, which result from different loads or stresses. The loads/stresses considered can be applied in any direction and location within the three-dimensional structure of the porous solid body. The three-dimensional poro-elasto-plastic finite element model may estimate the deformations in accordance with the linear elastic and the nonlinear plastic behavior of the porous solid body material. These behaviors may be first examined through lab experiments, which may then be used to inform the numerical model about the loading/stress points at which a certain material will transition from elastic (temporary) and linear deformation to a plastic (permanent) and nonlinear deformation. The linear and non-linear terms refer to the relationship between the applied stress and the strain (deformation) in a 2D plot.

The FEM code may include instructions for performing a pre-processing procedure using pre-processing code, which may include instructions for generating an initial mesh of an initial wellbore model, assigning loads to the initial wellbore model, and assigning heterogenous material properties to the initial wellbore model.

Figure 4A:
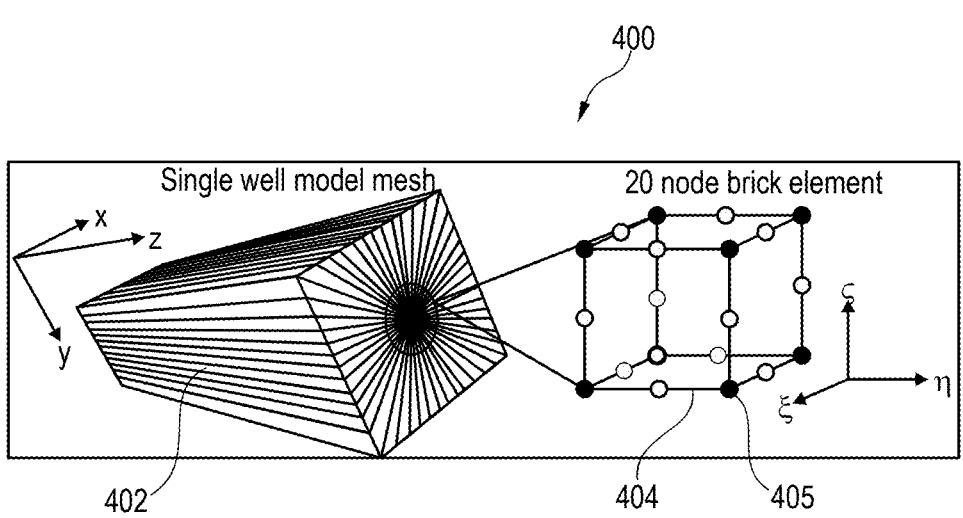
FIGS. 4A-4B show steps in a pre-processing procedure according to embodiments of the present disclosure.
Figure 4B:
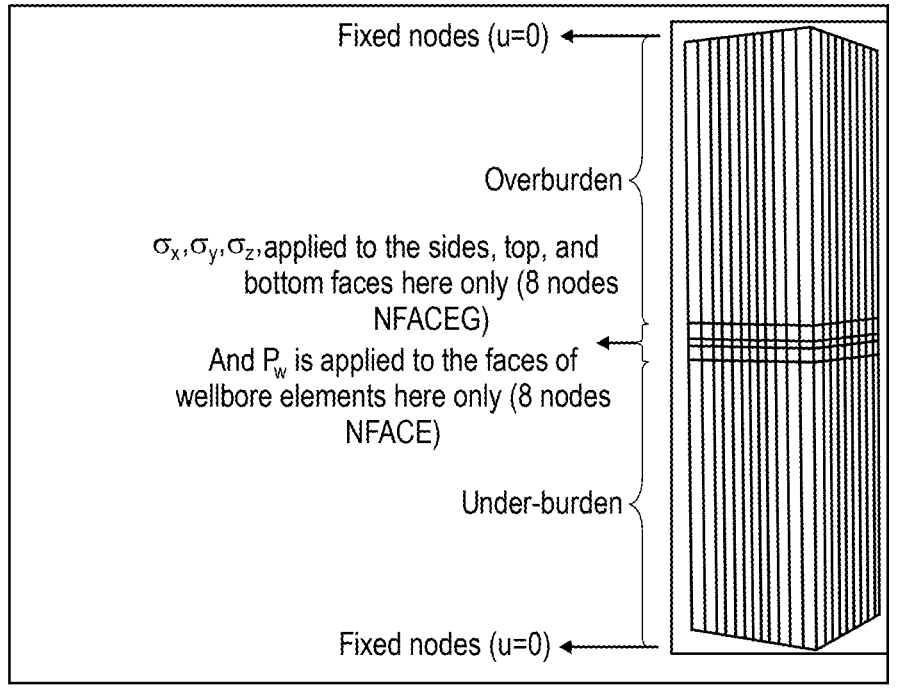

For example, FIGS. 4A-B provide an illustration of functions that may be performed in a pre-processing procedure 400 to form a three-dimensional rendition of a wellbore as it penetrates different layers of the formation. For example, in creating an initial mesh 402 of an initial wellbore model, the initial mesh 402 may be formed of a plurality of isoparametric elemental units 404 connected together at a plurality of nodes 405 (e.g., 20 nodes) around the edges of each elemental unit 404. The initial mesh 402 may have loads assigned to the initial wellbore model, including the drilling fluid weight hydrostatic or dynamic pressure on the wellbore (which acts on the inside of the wellbore wall) and three earth in-situ stresses, which are the vertical stress, the minimum horizontal stress, and the maximum horizontal stress acting on the outside faces of the wellbore model.

As shown in FIG. 4B, the initial wellbore model may have nodes 405 at axial ends of the initial wellbore model set at an initial displacement of zero and stresses applied at a section of interest in the model, e.g., including stresses, $\sigma$, applied to the sides of the element units 404 and wellbore pressure $P_w$ (the load that acts on the wellbore wall) applied to the faces of the wellbore elemental units 404 (e.g., from the hydrostatic pressure of the drilling fluid column and the annular frictional losses due to pumping the fluid out of the wellbore). The section of interest in the model may be selected between a section of overburden rock (rock overlying an area of interest in the subsurface formation) and a section of under-burden rock (rock below the section of interest in the subsurface formation). Overburden and under-burden sections of rock may be relevant in calculating pressure and other forces on the section of interest in the wellbore model; providing realistic boundary conditions to the 3D wellbore model so that the section of interest being analyzed is not suspended in the air; and arresting the rock deformation in the direction parallel to the wellbore axis.

Various parameters may be applied on an elemental unit basis, which may be accumulated together to provide the overall model. For example, a static load vector for each elemental unit (e.g., due to gravity) may be calculated, elemental unit stiffness matrices may be constructed based on the material properties of the rock (e.g., elasticity), which may be provided as inputs, and other elemental unit parameter equations may be used to construct the overall initial wellbore model. According to embodiments of the present disclosure, the FEM model may apply discretization of the overall wellbore structure unit 402 using a minimization of total potential energy equation, which produces the following equilibrium:

$$u \int_{V^e} ((B^T)D \ B) d\Omega = \int_{V^e} N^T F \ d\Omega - \int_{S^e} N^T T \ d\Gamma \qquad \text{Eq. 1}$$

where u is the displacement, B and $B^T$ are the strain-displacement matrix and its transpose, respectively. $N^T$ is the transpose of the quadratic Serendipity shape functions vector (derived for the 20-node isoparametric element unit 404 shown in FIG. 4A), D is the consistent tangent matrix, which is formulated based on mechanical properties of the rock, F is the body force, and T is the traction force. The body and traction forces reflect the in-situ stresses and mud weight loading on the wellbore, which may be applied in the pre-processing procedure during assigning loads to the initial wellbore model and assigning heterogenous material properties to the initial wellbore model. The integrations in this equation are performed for the element volume $(V^e)$ with respect to the volume variable $(\Omega)$ or for the element surface $(S^e)$ with respect to the area variable $(\Gamma)$. The matrix resulting from the integral in the expression of the left side of Equation 1 $(u \int_{V^e} ((B^T)D \ B) \ d\Omega)$ is known as the stiffness matrix $(K^e)$.

An FEM model may be formed based on the plastic flow rule for strain hardening to reflect the plastic behavior of the rock, which occurs beyond the yield point. This means that the total strain is the addition of two components, which are poro-elastic strain $(\varepsilon^e)$ and a plastic strain $(\varepsilon^p)$. The plastic flow rule assumes that the flow direction is perpendicular to the yield surface $\psi$ and it is defined as:

$$\Delta \varepsilon_{ij}^p = \lambda \frac{\partial \psi(\sigma_{ij})}{\partial \sigma_{ij}} \qquad \text{Eq. 2}$$

where $\varepsilon_{ij}^p$ is the plastic strain tensor, $\sigma_{ij}$ is the stress tensor, and $\lambda$ is the plastic strain multiplier. The associative flow rule is applied by assuming that the plastic potential surface is the same as the yield surface $\psi$. It also assumes the yield surface expands without changing the flow direction. The yield criterion used in this work is the Drucker-Prager criterion, where yielding will take place when the deviatoric stress tensor $(S_{ij})$ and the mean stress $(\sigma_m)$ satisfy the following relationship:

$$\psi(\sigma_{ij}) = \sqrt{\frac{1}{2} S_{ij} S_{ij}} - a_0 + a_1 \sigma_m = 0 \qquad \text{Eq. 3}$$

where constants $a_0$ and $a_1$ may be determined experimentally as material properties and are used to correlate the Drucker-Prager criterion to the Mohr-Coulomb criterion.

The following expression for strain hardening may then be used to calculate the scalar plastic strain EP from the plastic strain tensor determined by the flow rule:

$$\varepsilon^p = \int \sqrt{\frac{2}{3} d\varepsilon_{ij}^p d\varepsilon_{ij}^p} \qquad \text{Eq. 4}$$

While previous used modeling techniques for modeling a wellbore have relied on the assumption that rock deforms in a linear fashion as it is being subjected to a stress (load), methods according to embodiments of the present disclosure incorporate plastic (non-elastic) behavior of rock into the model of the wellbore. Thus, models of a wellbore according to embodiments of the present disclosure may reflect deformation of rock after it has undergone a permanent deformation.

According to embodiments of the present disclosure, material properties of the rock being modeled in an FEM model of a wellbore may be acquired from material testing of the wellbore rock. In some embodiments, material properties may be acquired from a library of rock testing containing records of mechanical properties of different rock type. A library of rock properties (e.g., including rock material testing results) may be digitally stored and may be accessible by and/or stored in the computing system 130. For example, in some embodiments, an FEM program executed by computing system 130 may include instructions for retrieving the mechanical properties of at least one identified rock type of the wellbore and inputting the mechanical properties into the assigned material properties of the initial wellbore model.

After pre-processing, an output file from the pre-processing code may be inserted as an input into the core numerical modeling code (e.g., FEM modeling code). After inputting outputs from the pre-processing procedure into an FEM program, the FEM program may be implemented in order to generate the FEM model of the wellbore. For example, the FEM program may include instructions for applying a system of equations to the plurality of elemental units, applying loads to the initial wellbore model to construct a global stiffness matrix, and solving the system of equations.

FEM may be implemented through multiple subroutines and a driver code. The driver code may call twelve main subroutines that perform several functions including receiving the input file from pre-processing, applying loads to construct and assemble a global stiffness matrix, and solving the system of equations. Additional subroutines may be used for dimensions control.

Figure 5:
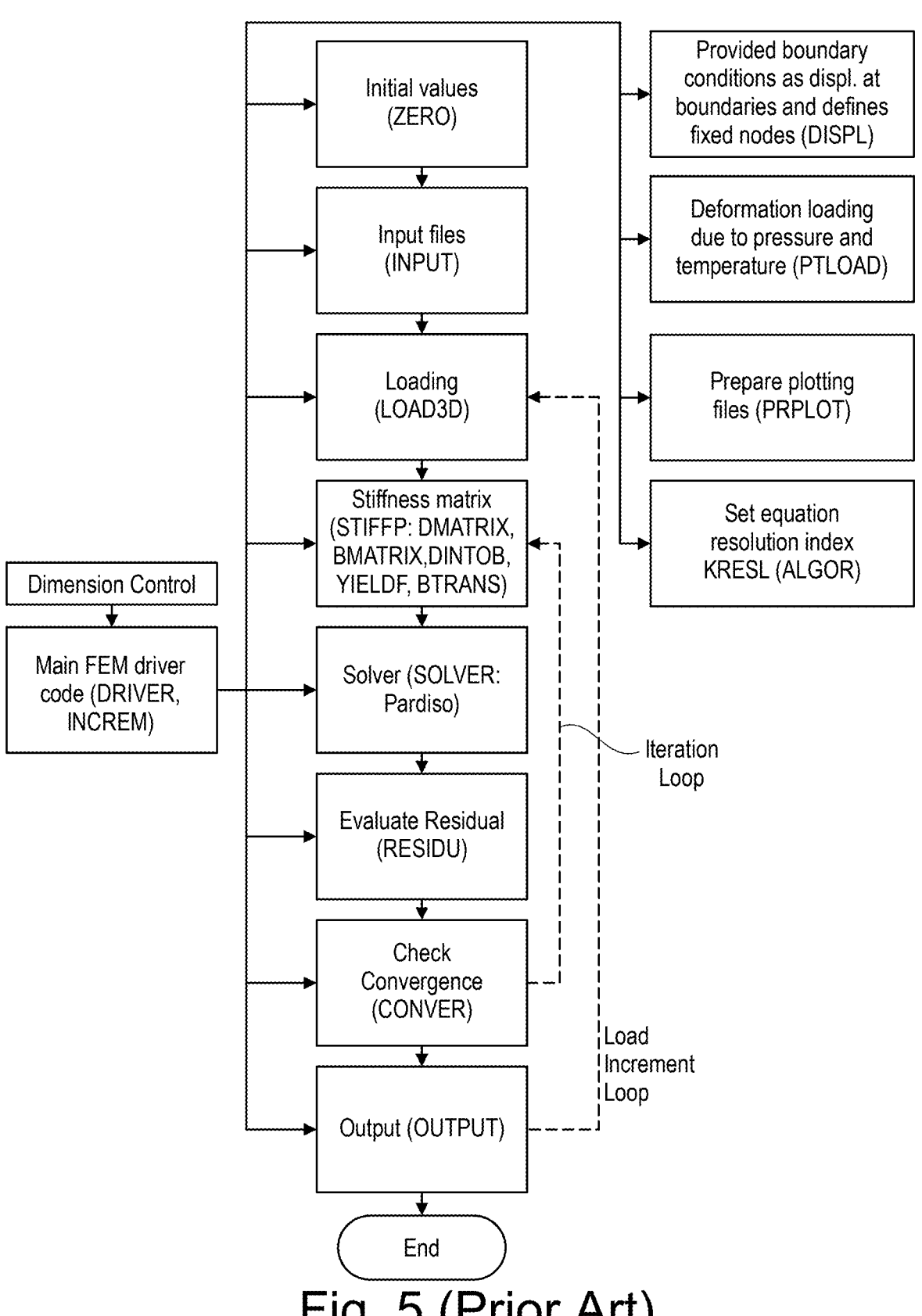
FIG. 5 shows a method used to generate an FEM model of a wellbore according to embodiments of the present disclosure.

A flow chart of the driver and the twelve main subroutines is shown in FIG. 5. As shown in FIG. 5, upon solving the system of equations from the pre-processing procedure, as described by Equation 1, and determining the displacements u, residual forces may be calculated to check for convergence and equilibrium by subtracting the left-hand side of Equation 1 from the right-hand side of Equation 1 in the global form, where the left-hand side is the global stiffness matrix multiplied by displacement and the right-hand side is the body and traction forces. The FEM may then solve the system of equations assigned to the plurality of elemental units from the pre-processing to approximate a solution by minimizing an associated error function, to reach a convergence close to or equal to equilibrium.

For example, the value obtained from the subtraction of left-hand side equation quantity and the right-hand side equation quantity should be equal to zero if the equilibrium condition is fully satisfied. However, when an exact equilibrium condition may not be achieved, a tolerance value may be set to check for convergence. The tolerance value may be set to be close to but not equal to zero. Once the residual forces are calculated and found to be less than the set tolerance value, convergence is said to be achieved, or otherwise, the residual forces may be carried to the next iteration. The same process may be repeated for each separate load increment, where the load increments are defined in the input file manually. These processes may be carried out in two loops with the convergence loop nested in the load increment loop as shown in FIG. 5. The resulting FEM model of a wellbore may be a three-dimensional model of the wellbore.

FEM models may be generated using various software packages, including FEA software packages, where the same or different software packages may be used for one or more steps in generating an FEM model of the wellbore. Examples of suitable software packages are shown in different steps in the flow chart of FIG. 5, and may include, for example, Pardiso, STIFF, DMATRIX, and BMATRIX software packages.

Figure 6:
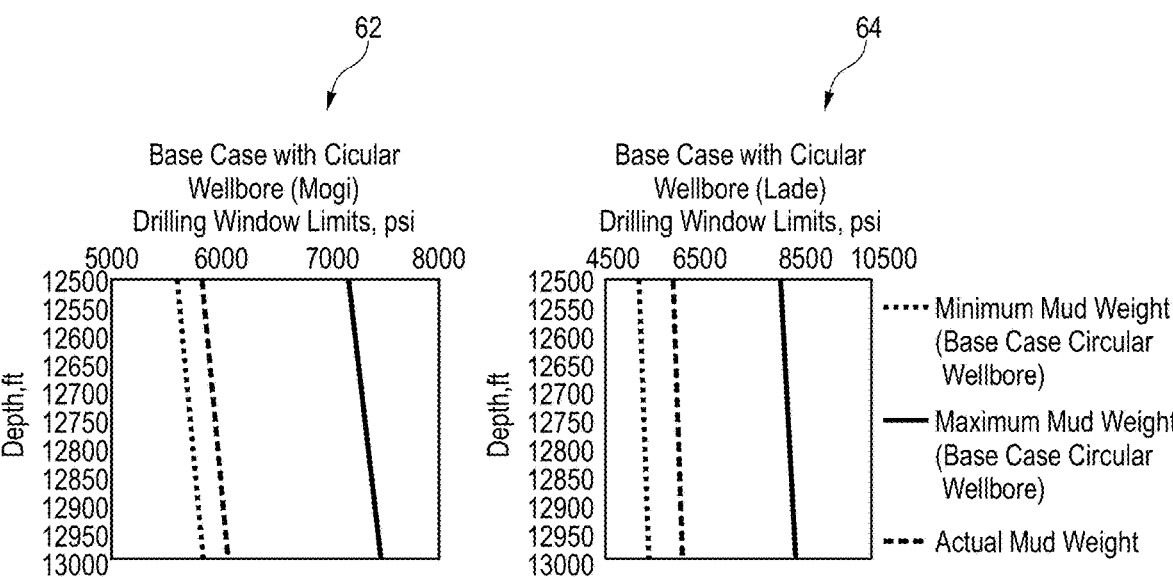
FIG. 6 shows FEM outputs for drilling window limits according to embodiments of the present disclosure.

Generating an FEM model as described above and according to embodiments of the present disclosure may be used to decide several parameters relating to wellbore rock failure, e.g., notably, the drilling fluid weight or downhole pressure required for preventing wellbore failure. An example of an initial output of the FEM model, which relates to recommending drilling fluid weights for preventing wellbore rock failure under different failure criteria is shown in FIG. 6. For example, FIG. 6 shows examples of a first output 62 that was generated using Mogi's failure criterion for predicting the failure of rock in response to different stress states and a second output 64 that was generated using the Lade failure criterion for predicting the failure of rock in response to different stress states. Different failure criteria may account for different affects of stresses on the rock (e.g., how much influence an intermediate principal stress has on rock strength). By using FEM to generate an initial model of the wellbore, different failure criteria (and other inputs) may be quickly and easily switched to analyze different situations in the wellbore.

Using FEM offers several advantages over what has previously been used in drilling engineering for geomechanics modeling. For example, while previously used modeling mostly relied on linear elastic analytical solutions or linear elastic simplified numerical solutions, numerical modeling (e.g., FEM) methods disclosed herein includes use of plasticity. Additionally, numerical modeling according to embodiments of the present disclosure may allow for a faster calculation speed, which may allow for a real-time or a while-drilling implementation of the model. Thus, using FEM or other numerical modeling described herein may allow for while-drilling implementation of a geomechanics model that considers the plastic behavior of the rock.

Image Analysis Module

The FEM model can be further improved by considering the effects of the cavings in the wellbore being modeled. To achieve this, dimensions of cavings returned from the physical wellbore (e.g., wellbore 110 in FIG. 1) may be measured, which may be used to determine the structure of the wellbore without the cavings. In other words, the measurements of returned cavings from a wellbore may be subtracted from the model of the wellbore to update the model of the wellbore, reflective of the missing caving pieces of rock. Manual measurements of the characteristics (e.g., shapes and dimensions) of the cavings may be performed. However, taking manual measurements may limit the applicability to FEM for real-time drilling operations. Methods and systems described herein allow for the use of image processing techniques along with artificial intelligence models for the automatic identification and characterization of cavings from images obtained by cameras in a cuttings return system.

For example, referring again to FIG. 1, images from the camera 124 may be sent to a computing system 130, where the computing system 130 may include one or more software modules for processing the images and identifying characteristics of rock fragments 103 captured in the images. Based on the rock fragments 103 identified in the images, the computing system 130 may generate a model of the wellbore, which may be used to determine one or more drilling parameters, such as a hydrostatic pressure range to maintain within the wellbore. For example, the computing system 130 may be used to identify and characterize cavings returned with rock fragments 103 from the well 100 and integrate the characteristics from the identified cavings (including dimensions of the cavings) into a numerical model of the wellbore 110.

Different types of image processing and artificial intelligence models may be used according to embodiments of the present disclosure, some of which are described in more detail below.

According to some embodiments of the present disclosure, an image analysis program may include an image segmentation program, which may include instructions for locating boundaries of objects in an image (e.g., images taken from one or more cameras in a cuttings return system) to identify the objects in the image, determining at least one dimension of the objects, and identifying a caving as at least one of the objects in the image based on the dimension(s). At least one algorithm may be used to classify the objects in the image having dimension(s) within a first range as cuttings and to classify the objects in the image having dimension(s) within a different range (e.g., a larger size range) as cavings.

Image segmentation may be used to locate objects and boundaries of the multiple objects in images, including, for example, separators, drilling fluid, cuttings, cavings, and other types of objects. A resulting set of cuttings and cavings contours may be extracted from the image using image segmentation.

For example, instance segmentation, which is a type of image segmentation, may be used to assign each pixel in the frame to each distinct object in the image. Thus, each cutting or caving in an image may be segmented as an individual object. Semantic segmentation, which is another type of image segmentation, may also be used to assign each pixel belonging to a class of objects. Thus, using semantic segmentation, all cavings and all cuttings detected in an image may be associated to their respective classes of cavings and cuttings. Other image segmentation techniques may also be used to identify cavings in images, such as thresholding, clustering, motion and interactive segmentation, histogram-based, edge detection, partial differential equations, graph partitioning, Chan-vese algorithm, geodesic active contours, among others.

While image segmentation techniques may be used to identify objects in images, a feature generation process in an image analysis program may further be used to automatically differentiate between cuttings and cavings. For example, a feature generation process may include extracting a set of features for each of the objects identified in an image, such as length, width, shape, among others, which may be measured in pixels or millimeters/centimeters calculated using a conversion scale that maps pixels to dimensions. Consequently, each identified cutting and caving object may be defined as $O_i$, such that $O_i = \{x_1, x_2, \ldots, x_n\}$, where $x_{1 \ldots n}$ represents the features defining the object. The features describing an identified caving may be used for the 2D and 3D reconstruction of the caving, which may be used in updating an FEM model of the wellbore (as described in more detail below in the meshing module section).

Figure 7:
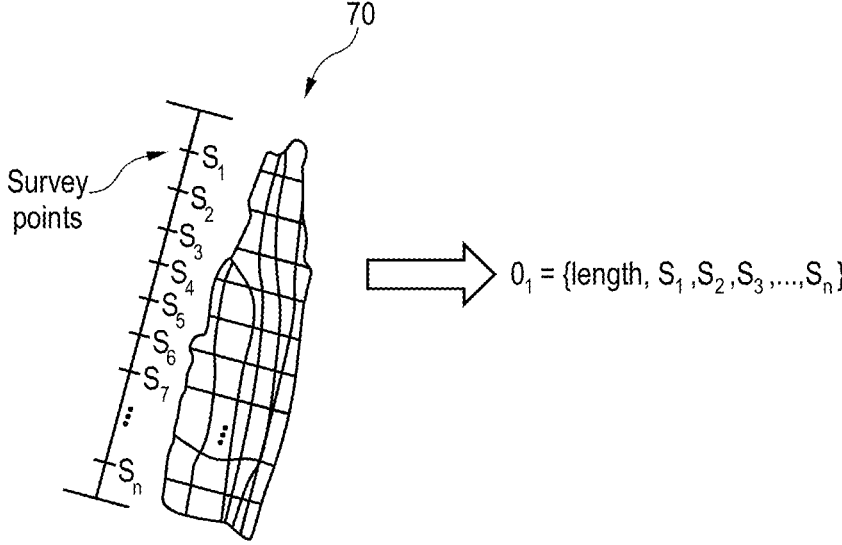
FIG. 7 shows a step for image analysis of a caving according to embodiments of the present disclosure.
Figure 8:
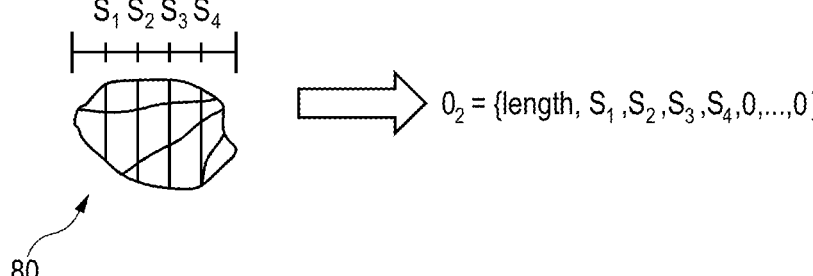
FIG. 8 shows a step for image analysis of a cutting according to embodiments of the present disclosure.

For example, FIGS. 7 and 8 illustrate an example methodology to determine multiple features for two objects 70, 80 that were identified from an image (e.g., using image segmentation). A fixed or variable number of survey points $(s_1, s_2, \ldots s_n)$ may be defined every x number of pixels with respect to the length of the object. For example, an image analysis program may include instructions for executing a conversion scale that maps pixels in images to dimensions of objects in the images, wherein the conversion scale may define survey points at an interval of a number of pixels along a selected dimension. A total amount of the survey points may then be used to measure the selected dimension, which may be used to define a feature of the object, such as width, length, shape, etc. For example, these survey points may be used to measure the width and/or length of the objects. The measured selected dimension may then be used to identify and/or characterize the objects. Since cuttings and cavings significantly differ in size, some survey points may not be possible for smaller cuttings. In these cases, survey points may simply set to zero.

After having identified objects in an image (from image segmentation) and defined the shape and dimensions of the objects (feature generation), artificial intelligence algorithms may be used to determine the class (caving or cuttings) for each object. Different unsupervised learning algorithms for anomaly detection, such as k-nearest neighbors, 1-class support vector machines, isolation forest, cluster-based local outlier factor, among others, may be used to automatically identify the cavings 70 and the cuttings 80 in the image. Alternatively, each object $O_i$, defined in the feature generation phase, may be assigned to a label y that indicates the type of object, i.e., $y \in \{caving, cutting, other\}$. The set of labeled objects $O_i = \{x_1, x_2, \ldots, x_n\}:y_i$ may be used to derive any supervised learning machine-learning model, such as random forest, artificial neural network, and decision tree, among others.

After having identified the cavings, the extracted contours of the objects obtained from the image segmentation and feature generation processes may be used to create 2D and 3D reconstructions. Several interpolation algorithms may be used to construct 2D and 3D models of the objects, such as marching cubes, marching squares, among others.

In some embodiments, a 3D model of an object from an image, such as a caving, may be generated using a stack of images that capture the different angles of the cavings. This can be achieved by tracking the cavings across the multiple frames (e.g., by considering the centroid distances or by using image registration techniques) along with interpolation techniques. For example, methods according to embodiments of the present disclosure may include taking multiple images sequentially as returned rock fragments are moved across a frame of the camera (e.g., on a separator screen or conveyor belt). A model of an identified caving in the images may be constructed by tracking the caving at different locations in the frame as the caving moves across the frame in the multiple images, determining dimensions of the caving from different angles in the different locations in the frame, and using the dimensions to construct the 3D model of the caving.

In some embodiments, an image analysis program may use a deep-learning program (e.g., you-only-look-once (YOLO), regional convolutional neural networks, etc) to analyze images received from a camera at a cuttings return system for object recognition. For example, a deep-learning program for object recognition may be used to directly discriminate between cuttings and cavings in an image. The use of deep-learning models may reduce the computational demands for object recognition when compared with image segmentation, which recognizes all objects in an image.

A deep-learning process may include manually identifying bounding box coordinates surrounding objects of interest (e.g., cavings) in a training set of images labeled with the objects of interest. The training set of images may have objects of interest such as cavings labeled with enough variations (e.g., cavings representing different shapes, colors, lighting conditions, drilling fluid types, etc.) sufficient to train the deep-learning program to recognize the objects of interest in different conditions. In such manner, a deep-learning program may be used to automate labeling cavings (or other objects returned from a well) in images of returned objects from a well based on a training set of images with manually labeled objects in the images. The training set of images may be taken using one or more cameras in a cuttings return system.

A deep-learning program may then be trained using the labeled images in the training set of images, containing the coordinates of the bounding boxes surrounding the objects of interest (e.g., cavings). Data augmentation (e.g., rotation, translation, cropping, resizing, coloring, shading, among others) may also be performed by the deep-learning program. Simple data split (train/validation/test) or cross-validation techniques may be used to tune the hyperparameters of the deep-learning program. Additionally, transfer learning may be used to consider pre-trained models (e.g., ResNet 100, ResNet 50, DarkNet, Inception, among others), to simplify the training and development of the deep-learning program.

After training, the deep-learning program may be used to identify cavings in images taken by camera(s) in a cuttings return system. The output of a trained deep-learning program may include 1) bounding box coordinates surrounding a detected caving in a frame and 2) the confidence value of the identified region being a caving.

In contrast to image segmentation techniques that are applied to an entire image, deep-learning programs may perform image segmentation in only the region of an image surrounding an identified caving (which may be identified by the deep-learning program). Thus, the result of image segmentation using a deep-learning process may include the set of cuttings and cavings contours extracted from the bounding boxes only. The extracted contours of the objects obtained from the image segmentation in the bounding boxes may then be used to create 2D and 3D reconstructions of cavings. The 2D and/or 3D models of cavings generated from a deep-learning process may be used to update an FEM model of a wellbore, as described in more detail in the below meshing module section.

Meshing Module

As provided above, systems and methods according to embodiments of the present disclosure may include taking images of returned rock fragments (including cuttings and cavings), identifying the rock type of the returned rock fragments, performing FEM using the identified rock type and assigned mechanical properties to generate a wellbore model, performing image processing on the images to identify and differentiate cavings from cuttings and identify their shape and dimensions, and using the identified dimensions of cavings to update the map or 3D mesh of the wellbore structure in the wellbore model to provide an updated, adjusted FEM model of the wellbore. Identified features of returned cavings (e.g., shapes and dimensions of cavings identified using image analysis) may be incorporated into a 3D mesh of a modeled wellbore structure using a meshing wellbore algorithm.

A meshing wellbore algorithm may be used for post-processing cuttings return system image data, where the meshing wellbore algorithm may allow for the integration between an FEM model of a wellbore and 2D/3D models of cavings returned from the wellbore and obtained from images of the cavings. The meshing wellbore algorithm includes creating an updated mesh of the wellbore, which reflects the dimensions and geometry of the identified and characterized cavings. To provide the updated mesh of the wellbore, the meshing wellbore algorithm may include reading images and adjusting the coordinates of the structure describing the wellbore mesh. Through this algorithm, the dimensions of an identified caving may be conveyed and reflected on the wellbore structure.

Figure 9:
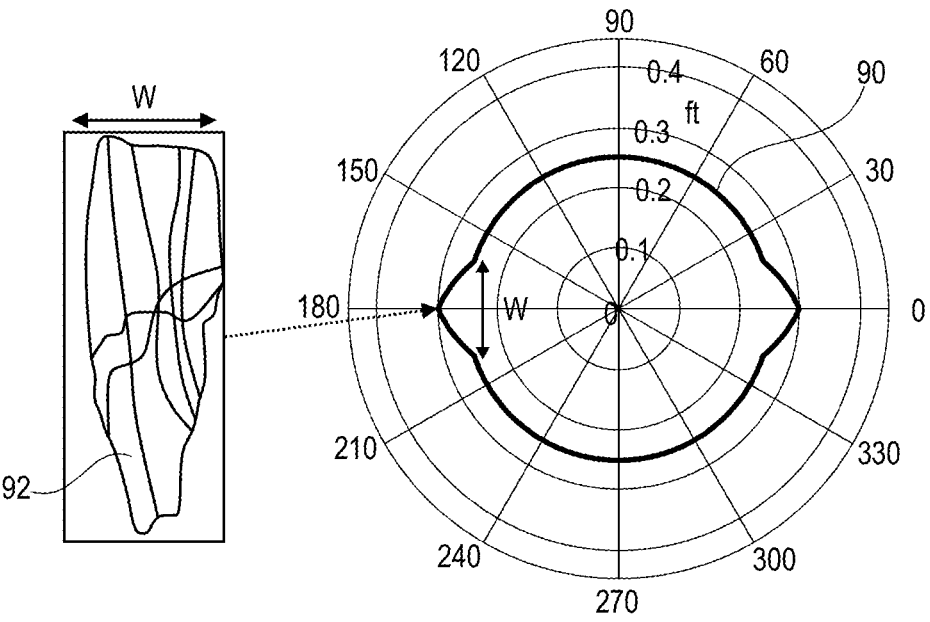
FIGS. 9 and 10 show steps for integrating dimensions of an identified caving into a mesh of a wellbore to provide an adjusted model of the wellbore.
Figure 10:
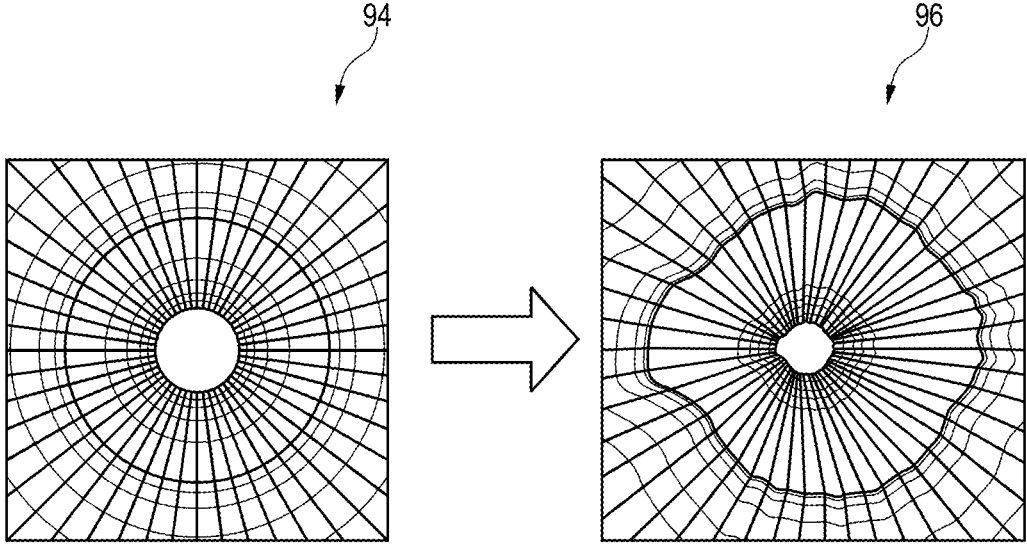

For example, FIGS. 9 and 10 show how dimensions of an identified caving may be integrated into a mesh of a wellbore 90 to provide an adjusted model of the wellbore. In FIG. 9, an image of a caving 92 may be processed using one or more image analysis processes described above to identify the object as a caving and to determine one or more dimensions W or other features (e.g., the shape of the caving). The dimensions W of the caving rock fragment may then be taken out of the structure provided by an initial model of the wellbore 90 to reflect an updated shape of the wellbore missing the caving 92. For example, FIG. 10 shows in an initial mesh 94 of the wellbore and an adjusted mesh 96 of the wellbore having the shape of the caving 92 removed from the initial mesh 94. Once the wellbore structure is updated based on the information extracted from the image (s) of the caving 92, an updated mesh may be created using the meshing wellbore algorithm according to embodiments of the present disclosure, as shown in FIG. 10. While conventional models of wellbores model the shape of the wellbore based on the assumption that the wellbore is about the same size (diameter) as the drill bit used to drill the wellbore, methods disclosed herein incorporate the sizes of rock fragments lost from the wellbore while drilling into models of the wellbore, such as shown in FIGS. 9 and 10.

Thus, by using systems and methods disclosed herein, identification and characterization of the rock fragments, particularly cavings identified in the rock fragments, returning with drilling fluid from a drilling operation may be used to generate more accurate numerical models of the wellbore as it is being drilled. For example, referring to the system shown in FIG. 1, methods may include directing drilling fluid 102 returning from the wellbore 110 to a separator 121, separating rock fragments 103 from the drilling fluid 102 in the separator 121, continuously taking images of the rock fragments 103 separated from the drilling fluid 102, sending the images to the computing system 130, identifying and characterizing at least one caving from the images using an image analysis program provided in the computing system 130, and using characteristics of the at least one caving identified from the image analysis program to construct an FEM model of the wellbore 110 by meshing model(s) of the caving(s) with a mesh of the wellbore.

Methods and Applications

Numerical modeling of wellbores according to embodiments of the present disclosure may provide advisories on drilling window limits for the wellbore being modeled. For example, an FEM model of a wellbore generated according to embodiments of the present disclosure may provide recommendations for the maximum and minimum allowable drilling fluid weight for safe and optimal operations, which are estimated to avoid wellbore rock failure. Additionally, unlike conventional drilling window advisory systems that provide static or pre-drilling recommendations and lack the ability to update drilling window recommendations in response to commonly occurring drilling events in a dynamic and deterministic manner, FEM models of a wellbore according to embodiments of the present disclosure may be continuously updated each time a caving is identified and characterized through image analysis. In such manner, systems and methods according to embodiments of the present disclosure may be used to consider the influence of commonly occurring drilling events through the input provided from image analysis of a cuttings return system.

Figure 11:
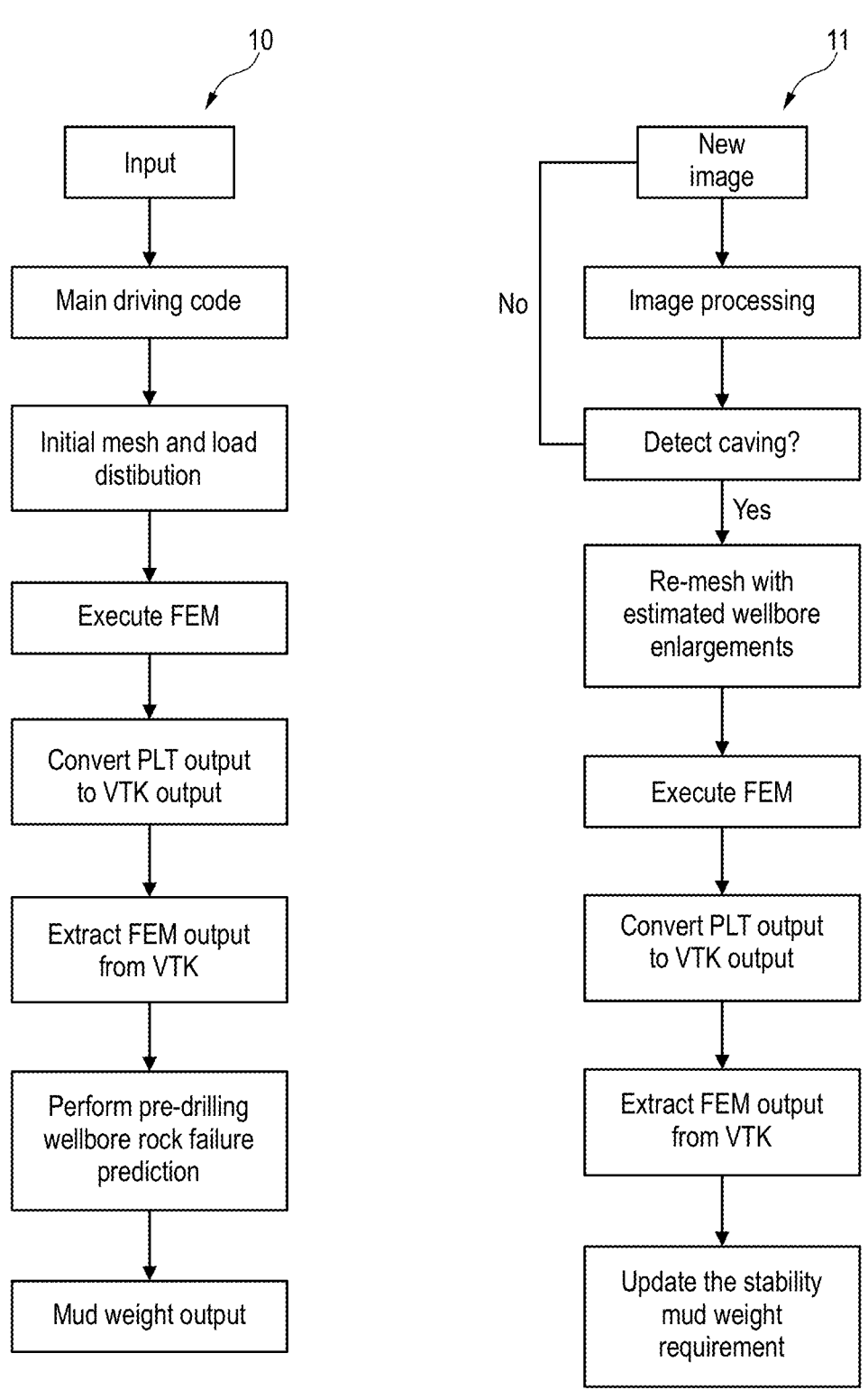
FIG. 11 shows a flow chart of a pre-drilling process to determine the pre-drilling mud weight for a wellbore and a flow chart of a while-drilling process to determine the while-drilling mud weight update for the wellbore according to embodiments of the present disclosure.

FIG. 11 shows flow charts depicting differences between a pre-drilling process 10 to determine the pre-drilling mud weight for a wellbore and a while-drilling process 11 to determine the while-drilling mud weight update for the wellbore according to embodiments of the present disclosure.

In the pre-drilling process 10, inputs, such as rock type and downhole pressure, may be entered into a main driving code (e.g., an FEM modeling code) to develop an initial mesh and load distribution of the wellbore. FEM may then be executed on the initial mesh of the wellbore to develop an initial wellbore model. Different file types may be used with different software programs. For example, the initial wellbore model may initially be readable with a vector-based plotter (PLT) file, which is an extension for files commonly used in computer assisted design (AutoCAD) to enable visualization software in translating numbers and coordinates in 3D visuals. A PLT output from the FEM program may be converted to a visualization toolkit (VTK) file, which serves an identical function to the PLT file but is readable by different 3D visualization software. A pre-drilling wellbore rock failure prediction may then be performed on the wellbore model to determine an estimate for initial drilling window limits, include an initial mud weight range to use in the wellbore for drilling in order to minimize failure of the wellbore and maintain sufficient hydrostatic pressure.

In the while-drilling process 11, an image of rock fragments collected from a wellbore drilling process may be taken at a cuttings return system (e.g., at a separator) and then analyzed using one or more image processing techniques to detect caving(s) in the collected and imaged rock fragments. New images of subsequently collected rock fragments may be taken and analyzed until the image processing procedure detects a caving. When a caving is detected from an image, the image processing procedure may also include determining features of the caving, including dimensional features, and/or modeling the detected caving. The determined size and/or shape of the caving may be removed from an initial mesh of the wellbore to generate an adjusted mesh of the wellbore having an enlargement corresponding with the caving formed into the wellbore wall structure. In some embodiments, when a caving is detected and modeled, the determined size and/or shape of the caving may be removed from opposite sides of an initial mesh of the wellbore to generate an adjusted mesh of the wellbore having two enlargements corresponding with the caving formed into opposite sides of the wellbore wall structure. Because cavings are typically observed as taking place in opposite sides of a wellbore (as being aligned with the direction of the earth minimum horizontal in-situ stress), the single detected caving may indicate two, opposite sides of the wellbore are caved.

FEM may then be executed on the adjusted mesh of the wellbore to develop an adjusted wellbore model. The adjusted wellbore model may be outputted as a PLT file, which may be converted to a VTK file for running wellbore performance analysis via FEM and determining updated drilling window limits, including an updated mud weight range to use in the wellbore for drilling in order to minimize failure of the wellbore and maintain sufficient hydrostatic pressure. Accordingly, while-drilling processes according to embodiments of the present disclosure may allow selection of appropriate mud weight for the wellbore based on an adjusted mapped structure of the wellbore, including where caving has occurred, and the mechanical properties of the wellbore rock.

Figure 12:
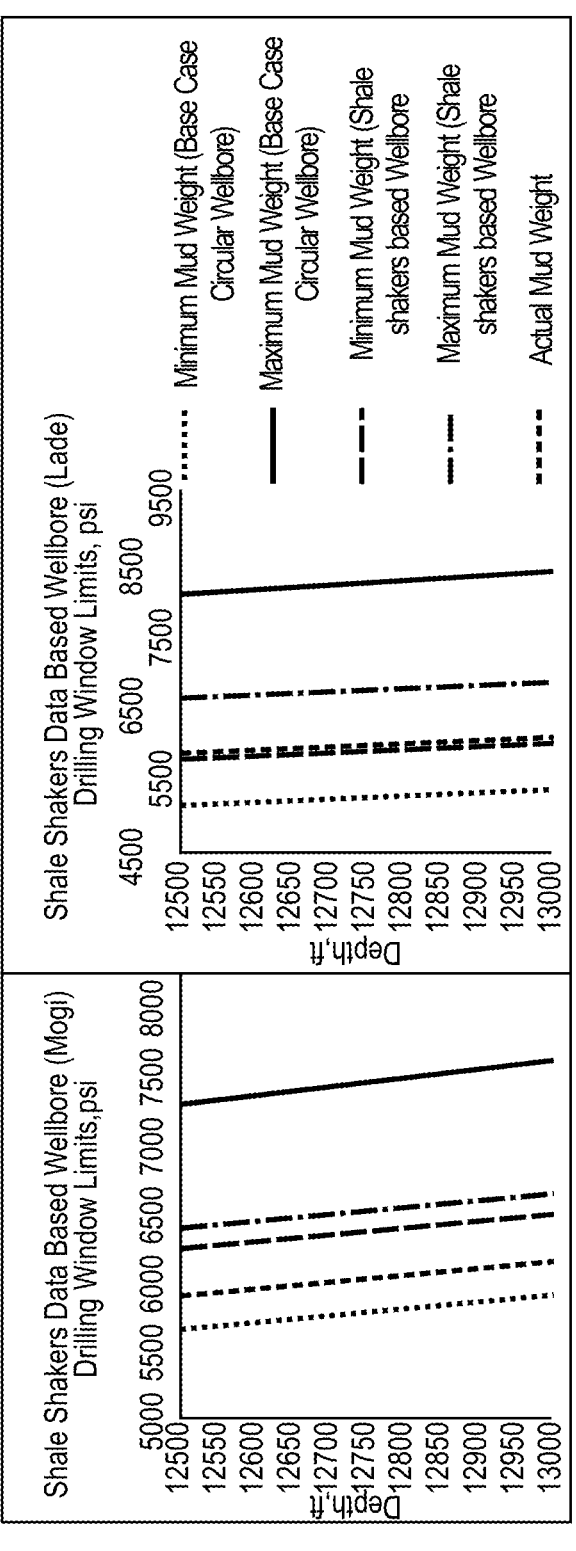
FIG. 12 shows FEM outputs for adjusted drilling window limits according to embodiments of the present disclosure.

For example, FIG. 6, discussed above, shows an illustration of recommendations for mud weight limits from a pre-drilling process. By using while-drilling or post-drilling processes according to embodiments of the present disclosure, the drilling window recommendation may be updated based on the input from image analysis of image(s) taken of rock fragments collected from a wellbore drilling process. Using such image analysis, a wellbore structure mesh may be updated, such as shown in and described with respect to FIGS. 9 and 10. The updated mesh may then be inserted into the core FEM code to provide updated drilling window limits, e.g., mud weight limits or downhole pressure required for preventing wellbore failure. An example of an updated output of the FEM model for mud weight recommendations is shown in FIG. 12 using Mogi's failure criterion and the Lade failure criterion for predicting the failure of rock in response to different stress states.

The integration of cuttings return system image analysis and the FEM geomechanics model of a wellbore provides a unique ability to describe and update the spatial variability of the drilled subterranean geologic formations as drilling progresses. From the FEM side, unlike other analytical solutions, the numerical nature of FEM allows consideration of the interaction of materials with different mechanical properties. This ability ensures that the wellbore rock spatial variability and heterogeneity may be reflected in the process of evaluating deformations. FEM enables consideration of the interaction between materials with different mechanical properties by assigning different material types, and therefore different properties, to the different elemental units defined in the structure mesh. From the image analysis side, monitoring the coloration, shape, and texture of cavings and other rock fragments observed in the cuttings return system (e.g., after being separated in a separator) may help identify the rock type (i.e., lithology) being drilled. The identified rock type can be communicated to the FEM pre-processing and meshing code to assign the mechanical properties associated with it to corresponding elemental units of the mesh. Notably, the computational models for image analysis may consider an expected profile of particle characteristics associated with a specific bit type, formation, activity, or depth of drilling.

For example, as described above, methods according to embodiments of the present disclosure may include taking at least one image of a plurality of returned rock fragments from a wellbore, analyzing the image(s) with an image analysis program to detect a caving in the plurality of returned rock fragments, identifying at least one feature of the caving (e.g., rock type, dimensions, etc.), incorporating the feature(s) of the caving into an FEM model of the wellbore using a meshing program to create an adjusted model of the wellbore. Image analysis may also include detecting at least one characteristic of the caving and modeling the caving (e.g., where the model includes determined characteristics of the caving), where incorporating the model of the caving into the FEM model of the wellbore includes incorporating determined characteristics of the caving into the material properties assigned to the initial wellbore mesh.

Additionally, in embodiments where image analysis identifies a rock type of the caving, mechanical properties of the rock type may be retrieved from a library of rock properties. The library of rock properties may be populated with mechanical properties for an amount (e.g., some or all) of known rock types. For example, assuming that the area or field where a well is being drilling has a stratigraphic column which shows that the well will penetrate a sandstone, dolomite, shale, siltstone, and limestone subterranean geologic formations, the library may be populated with the mechanical properties of each one of these rock types. In some embodiments, the library may include stress-strain test results and the mechanical properties of all rock types encountered while drilling in a particular field. Rock libraries may be populated, for example, based on lab tests performed on rock core samples from all relevant subterranean geologic formations. Mechanical properties from a library of rock properties may be incorporated into the material properties assigned to a mesh of the wellbore.

According to embodiments of the present disclosure, image analysis may also be used to incorporate rock failure modes into the FEM model of the wellbore. For example, methods according to embodiments of the present disclosure may include identifying a mode of failure of a caving identified in an image(s) from image analysis and using the identified mode of failure to determine a structural state of the wellbore. The determined structural state of the wellbore may be incorporated into an FEM model of the wellbore.

Figure 13:
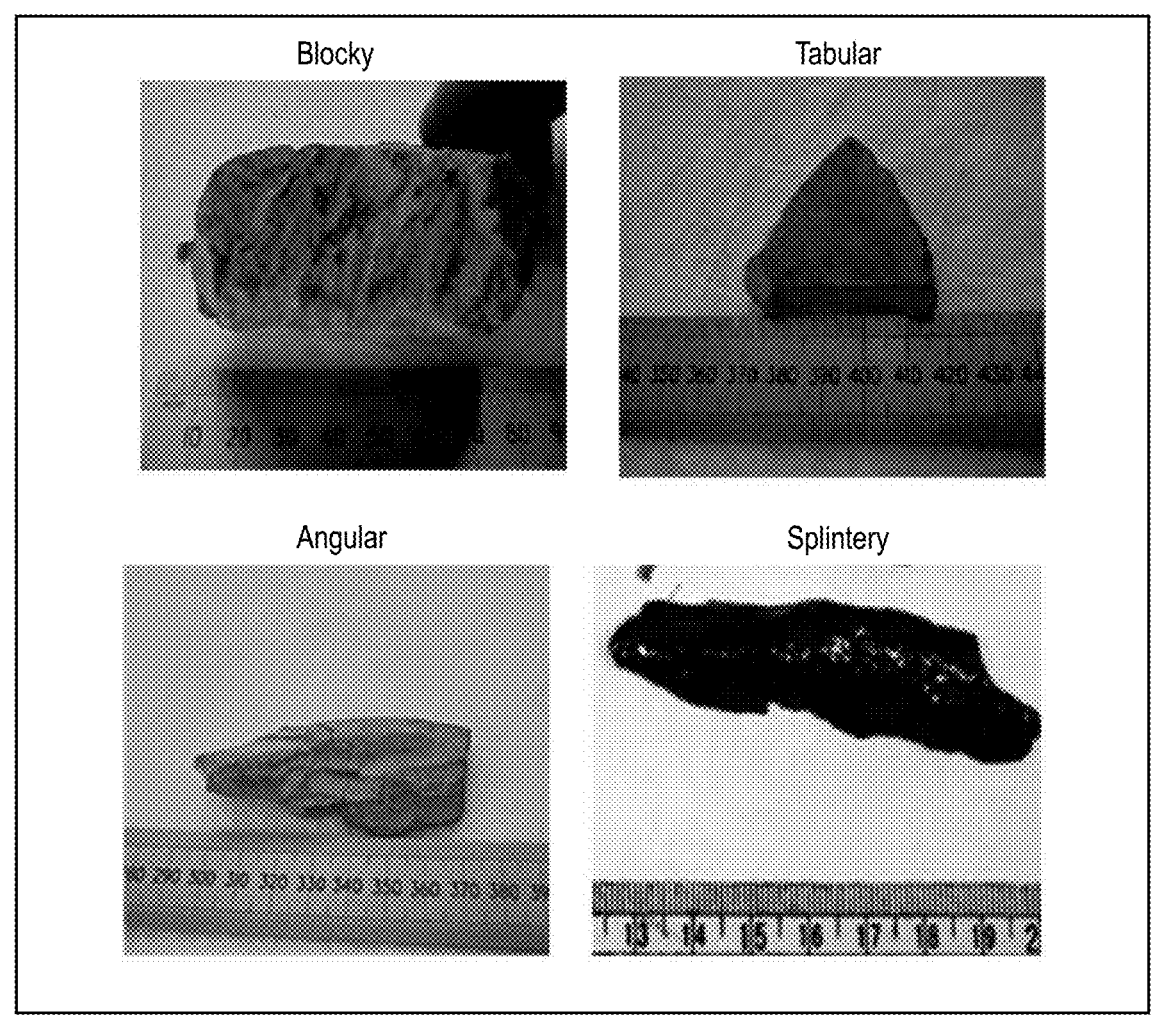
FIG. 13 shows different types of cavings.

Rock mode of failure and structural state of a subterranean geologic formation may be determined by cavings shape matching during image analysis. For example, FIG. 13 shows examples of rock fragments having different shapes. Blocky and tabular cavings are known to commonly be produced from naturally fractured formations or from weak bedding planes. Thus, when cavings having blocky and tabular shapes are observed and confirmed, an FEM model and its mesh may be updated to reflect weak bedding planes or a fractured formation in the wellbore rock structure. By performing shape matching to identify modes of failure and/or the structural state of the formation, the FEM model and its mesh may be calibrated as drilling progresses, which may provide more reliable recommendations and advisory systems. The shapes of cavings, which may be used to calibrate an FEM model of a wellbore, may include, for example, tubular or blocky shapes, which may indicate a naturally fractured formation or weak planes/bedding; angular shapes, which may indicate shear failure and insufficient mud weight; and splintery shapes, which may indicate over-pressured zones where tensile failure is prominent.

In addition to cavings shape matching analysis to reset/adjust the structure of the wellbore rock within an FEM mesh, physical cavings collected from a wellbore may be compared with predicted performance of the wellbore from an FEM model in order to analyze and update accuracy of the FEM model predictions. For example, the dimensions of a caving observed from the wellbore may be compared with predicted dimensions of a caving from an FEM model. In cases where the shape of cavings in both an FEM model prediction and observation from the wellbore is of a certain type (e.g., angular), a history matching type of analysis may be performed by comparing the predicted and observed dimensions and/or shapes. Within such history matching processes, the FEM model may reassess the drilled hole section to check for inaccuracies in the FEM model input information. By performing history matching processes against caving dimensions, the integration of image analysis and the FEM geomechanics model may ensure that the following input parameters of the FEM geomechanics model are accurate:

1) In-situ stresses: vertical, minimum horizontal, and maximum horizontal in-situ stress magnitude, which may be a major source of error in any type of geomechanics analysis;

2) Rock mechanical properties: such as the ultimate compressive strength (UCS), Young's modulus, and Poisson's Ratio, which may vary from those measured in the lab due to the formation rock heterogeneity; and 3) Downhole pressure fluctuations: FEM geomechanics model analysis may be performed based on the assumption that the mud weight is the sole factor controlling the downhole pressure. However, in cases where other events are also controlling the downhole pressure, such as surge and swab, the history matching process may help the model in identifying the occurrence of these events and reflecting their influence when adjusting the FEM model of the drilled wellbore.

Figure 14:
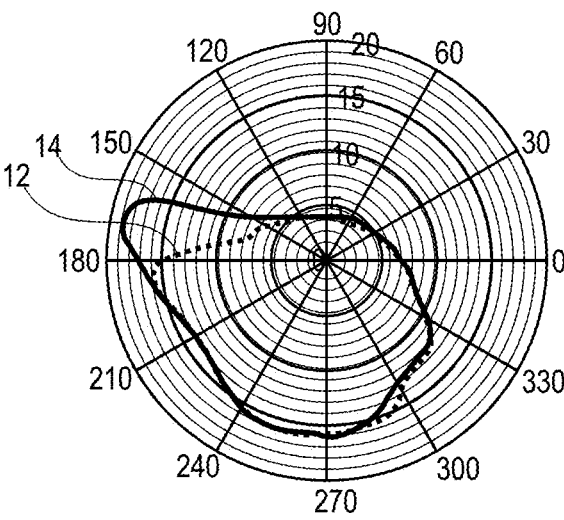
FIGS. 14-16 show steps in an FEM geomechanics model calibration process based on a caving shape matching process according to embodiments of the present disclosure.
Figure 15:
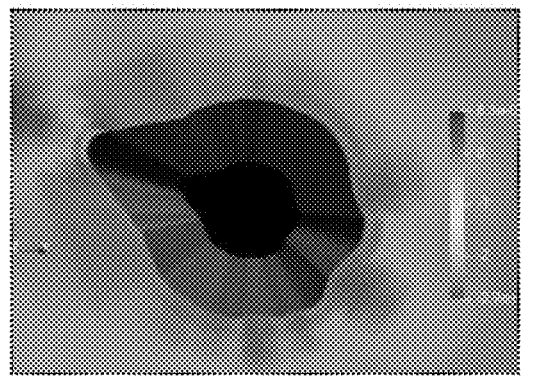
Figure 15:
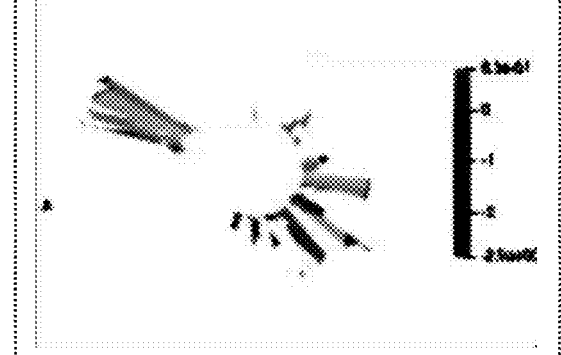
Figure 16:
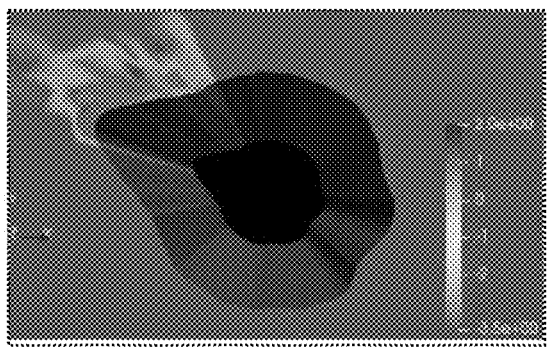
Figure 16:
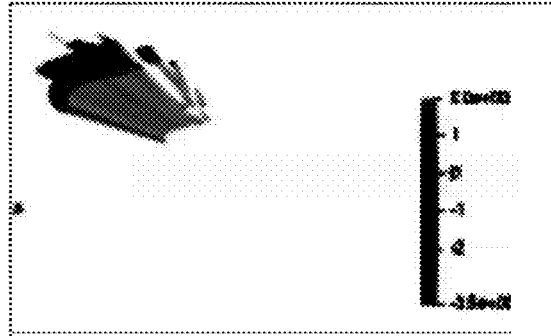

FIGS. 14-16 illustrate an FEM geomechanics model calibration process based on a caving shape matching process according to embodiments of the present disclosure. FIG. 14 shows an example of the progression of wellbore failure in a true-triaxial experiment performed on a bored sandstone core sample. In FIG. 14, a predicted wellbore structure 12 may be modeled based on cavings generated from the bored sandstone core sample inputted into a wellbore mesh, which may be compared to a model of a wellbore structure 14 based on caving shapes recovered from the wellbore. The objective of the analysis in FIGS. 14-16 was to predict the size and shape of the caving that was taken out of the predicted wellbore structure 12 that led to the resulting wellbore structure 14. FIGS. 15 and 16 compare methods for making such caving predictions.

FIG. 15 illustrates the prediction of cavings shape in the same experiment illustrated in FIG. 14 using the non-calibrated model, where the model on the left shows a prediction of failure zones using the Mogi failure criterion, and the model on the right is an illustration of cavings resulting from wellbore failure. FIG. 15 represents the observation of the cavings shape in a lab setting, which may be related to the observation of cavings recovered from the physical wellbore, but has not been calibrated using prior cavings data from the wellbore. As seen in the model on the right in FIG. 15, the modeled predicted cavings resulting from wellbore failure do not match the progression shown in FIG. 14, where a single caving was removed from the predicted wellbore structure 12 (in the upper left corner) to generate the resulting wellbore structure 14.

FIG. 16 is an illustration of the prediction of cavings shape in the same experiment illustrated in FIG. 14 using a calibrated model of the cavings, where the cavings size/shape are calibrated using data from previously collected cavings from the wellbore. The model on the left shows a prediction of failure zones using the Mogi failure criterion, and the model on the right is an illustration of cavings resulting from wellbore failure. As seen from the model on the right in FIG. 16, the caving prediction based on a calibrated model is more accurate than the prediction made using the non-calibrated model of FIG. 15, as the caving prediction from FIG. 16 may result in the resulting wellbore structure 14 of FIG. 14. Thus, as exemplified by the analysis shown in FIGS. 14-16, using prior cavings data to calibrate a model of a new caving may provide more accurate models of the cavings.

In some embodiments, cavings shape matching processes may be performed automatically using deep-learning models trained to identify the different types of cavings (e.g., blocky, tabular, angular, and splintery) from images. To achieve this, multi-class convolutional neural networks (CNN) may be used to determine the presence of a specific type of cavings in an image obtained from real-time video feed. CNNs are suitable deep-learning models for pattern recognition and image classification as CNNs exploit spatial correlation/dependencies in the data (pixels). However, CNNs may be unable to cope with variable output layers because the number of cavings/objects occurrences is variable (i.e., the number of cavings and types of cavings in an image will vary, or cavings may not be present at all in an image). Consequently, regional-CNN (R-CNN), fast R-CNN, faster R-CNN, You Only Look Once (YOLO), or other models for object detection, may be used to identify the type of cavings, highlight, and count the identified cavings in the frame. The output of these models for object detection may include 1) bounding box coordinates for each detected caving, 2) the type of caving, and 3) confidence of detection.

By using integration of image analysis of drilling operation rock fragments returns and numerical modeling of the wellbore, according to embodiments of the present disclosure, a real-time recommendation or advisory system may be developed. For example, an advisory system according to embodiments of the present disclosure may provide recommendations for drilling fluid additives to use in drilling operations, especially those operations with potential or observed wellbore instability, in order to maintain a recommended mud weight range while drilling.

Figure 17:
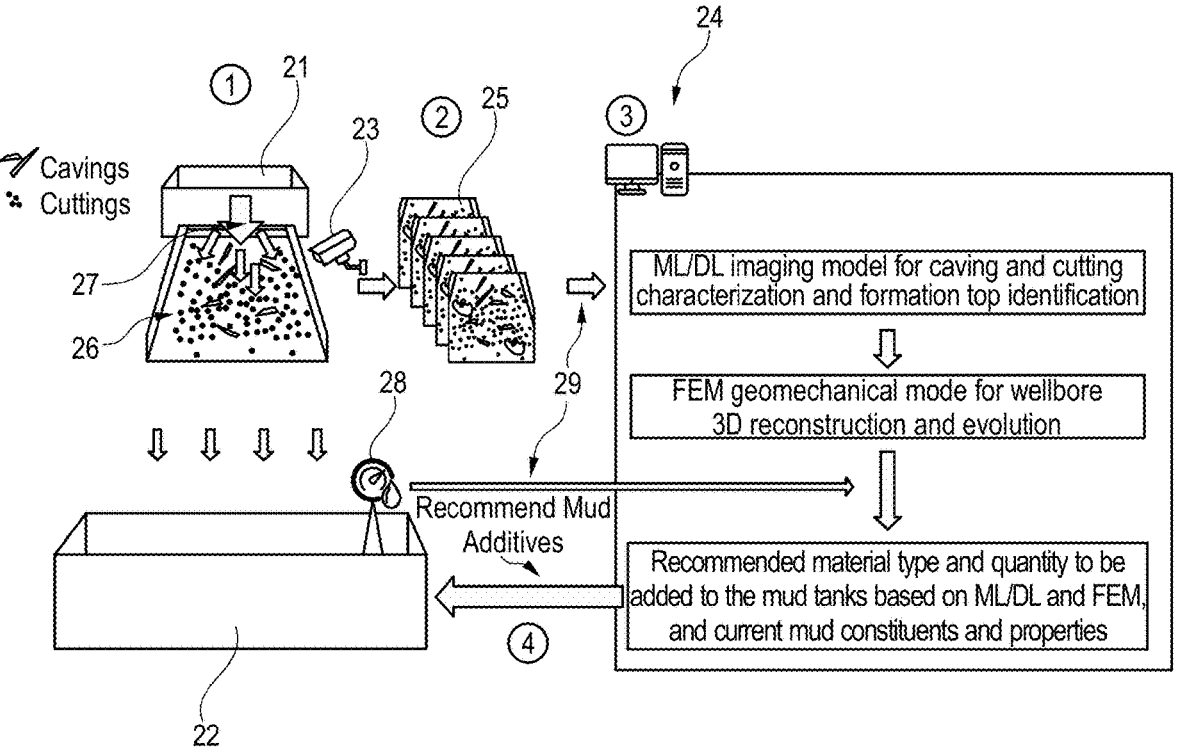
FIG. 17 shows a system according to embodiments of the present disclosure.

FIG. 17 shows a stepwise graphical representation of a process for providing drilling operation recommendations (e.g., drilling fluid additives to prevent or mitigate wellbore instability) using an advisory system 20 according to embodiments of the present disclosure. As shown in FIG. 17, a method for providing drilling operation recommendations may be divided into four major steps. First, drilling fluid 27 returning from a wellbore may be directed into a separator 21 though a header box (or possum belly) of the separator. Cuttings and cavings 26 may be sieved out by the separator 21 while the drilling fluid may be directed to a mud tank 22 to be circulated into the wellbore again for continued drilling. Meanwhile, a camera 23 may continuously capture video recordings 25 of the separator 21 (and any cuttings or cavings caught by the separator), where the video recordings 25 may be passed on to a computing system 24. Machine learning and deep-learning models may be used to characterize the cuttings and cavings (e.g., shape, volume, mass, etc.) from the video recordings 25 and identify formation types in real-time. Notably, static and real-time data (e.g., bit type, formation type, drilling fluid type, activity, and depth of drilling, etc.) may be used as inputs to develop one or several machine learning or deep-learning models to consider an expected profile of particle characteristics associated with the drilling conditions and lithology. The video recordings 25 may be processed using machine learning or deep-learning programs to characterize the cuttings and cavings to reconstruct an FEM geomechanical model of the wellbore.

A proposed FEM geomechanical model and wellbore meshing algorithm may be used to reconstruct and evaluate the wellbore for failures. Based on the reconstructed or observed wellbore failures, previous drilling data in the vicinity of the well that is being drilled (e.g., offset wells), and data 29 about the current mud system and its ingredients (e.g., which may be provided by mud tank sensors 28 on the mud tank 22 to continuously feed data 29 into the computing system 24), the computing system 24 may provide an advisory output with the type and amount of the chemicals or materials to be added to the mud system to adjust its properties, and ultimately minimize wellbore instability.

System constraints may also be provided to the computing system 24 with regards to the drilling fluid additives or materials that are actually available on the well site, where drilling fluid additives that are available on-site may be communicated to the computing system 24 to use in generating instructions for adding drilling fluid additives to the drilling fluid. In addition, this system can be fully autonomous when coupled with an automated mud additive system, where the recommended additives may be introduced to the mud tanks 22 without human intervention.

In some embodiments, an automated mud additive system may include one or more chemical/additive tanks which may each include a drilling fluid additive and a level indicator, which may be in communication with the computing system 24. For example, level indicators may be equipped with wireless transmitters that may transmit real-time chemical/additive level data to the computing system 24, thereby automatically verifying the amount of chemicals/additives that are added to the drilling fluid 27 from the additive tanks. Moreover, this information may be utilized to update the amount of drilling fluid additives needed to fill up the additive tanks, as well as to update the amount of drilling fluid additives left in the additive tanks, during the drilling process.

Wireless communication systems between sensors and equipment in a drilling system and the computing system 24 may utilize radiofrequency (RF) technologies, such as 4G and 5G.

In some embodiments, cameras may be positioned at various locations, at various angles, of the mud system in a non- or minimally invasive manner to observe and monitor the mixing and addition of drilling fluid additives to the drilling fluid. Cameras may utilize a wireless visible light communication (VLC) method known as optical camera communication (OCC) to transfer data between existing and new sensors in the mud system and cameras. OCC may offer advantages over RF communication, such as an unused, unlicensed/unregulated optical spectrum for communication, having no electromagnetic interference and a well-defined coverage zone that may result in inherent security, low power consumption due to the use of LEDs and user safety since there is no electromagnetic radiation during transmission. Data acquired by a sensor may be sent through an LED driver to an LED array, where the LED driver may regulate the power to the LED array depending on the sensor output. Modulation of light may be based on on-off-key (OOK) modulation, where the LED may be switched on and off according to the binary sequence of the sensor output. The transmitter may be a single LED or an LED array, where the LED is either a commercial monochrome LED or a white LED that is able to change the light intensity without flickering. The receiver may be an intelligent camera that receives the transmitted data and decodes the data through signal processing to an intelligible format.

A camera may detect an LED array using different methods. Cameras that employ CMOS image sensors can receive the transmitted information by observing the rolling shutter effect produced by the modulated LED by setting a short exposure time and increasing the sensitivity of the sensor, where the pulse frequency of the LED is lower than the rolling shutter's sampling frequency. For each frame received by the camera, the LED array may be decoded in a sequential manner by algorithms that extract the region of interest and perform image and signal processing to retrieve the transmitted sensor output. When using an under-sampled phase-shift on-off keying (UFSOOK) protocol, a camera may continuously under-sample the LED signal to produce steady states (either ON or OFF) or blink states (ON-OFF or OFF-ON). Additionally, in UPSOOK, the frequency of the synchronization frame may be represented by a square wave that corresponds to half ON illumination at the camera image sensor.

Other monitoring systems may be provided with the drilling fluid system, which may be used to monitor and communicate, for example, an amount of drilling fluid additives being used and available to the drilling fluid system.

In some embodiments, a computing system may be in communication with other equipment (in addition to or alternative to an additive tank) in the drilling system, including, for example, mud pump(s), equipment on the rig used in drilling, and valves used in controlling the flow of drilling fluid, to send and receive signals between the computing system and the drilling system. For example, a computing system may receive data from the drilling system, including but not limited to, data from a cuttings return system; data from the well system (including data from the wellbore such as downhole pressure and temperature and data from drilling equipment indicating drilling parameters such as drill depth, drill string rotational speed, valve positions, and others); and data from the drilling fluid system such as amount of additives added, drilling fluid flow rate, mud pump speed, drilling fluid temperature and pressure, etc. The computing system may also process and/or store the drilling system data to analyze process conditions and/or provide recommendations for adjusting the drilling plan (e.g., recommendations for altering the drilling fluid weight, pump rate, etc.).

By providing a monitoring system with the drilling fluid system, the computing system may provide more robust recommendations for maintaining wellbore stability in response to measured and predicted wellbore structure from a drilling process, based on a generated adjusted FEM model of the wellbore from detected cavings.

Additionally, while-drilling and post-drilling processes according to embodiments of the present disclosure may also include adjusting at least one drilling parameter based on a generated adjusted FEM model of the wellbore. For example, in addition to or in the alternative to altering an amount of drilling fluid additives to the drilling fluid to change a mud weight in the wellbore, altering a cementing plan, altering a lost circulation plan, altering a drill speed, or altering another drilling parameter may be recommended and/or performed based on an adjusted FEM model of the wellbore generated according to while-drilling or post-drilling processes according to embodiments of the present disclosure.

Systems and methods disclosed herein may allow for the automation and optimization of drilling operations by mitigating or preventing major challenges arising from drilling events (e.g., stuck pipe incidents, hole cleaning, poor cementing jobs, and wellbore enlargements) as the drilling events occur by reflecting the influence of the drilling even on a numerical geomechanics model. By analyzing the progress of drilling a well (including cuttings analysis, drilling performance, wellbore strength, and others), operational decisions may be made to improve the drilling process, and ultimately improve recovery from the well.

Conventionally used drilling geomechanics analysis typically includes building a 1-D mechanical earth model (1D MEM) before a well is drilled to issue recommendations regarding mud weights and wellbore rock failure. Based on conventional setup, recommendations from the model are assumed as static parameters, meaning they remain as constant values regardless of later-encountered drilling events. However, by using systems and methods according to embodiments disclosed herein, mud weight, rock failure, and other drilling parameter recommendations may be modeled as dynamic parameters to respond to various drilling events as they occur in a manner that was not previously possible.

Additionally, integration between FEM and cuttings return system image processing techniques may fill a gap in the area of real-time drilling geomechanics analysis. Conventionally, real-time drilling analysis has used density-based, ultrasonic-based, or resistivity-based logs from a logging while drilling (LWD) tool for the purpose of identifying wellbore enlargements. However, LWD may not be run in some reservoir sections, which may leave overburden formations with no information describing their wellbore rock failure while drilling. Because overburden formations typically represent the majority of the well, a lack of LWD can be a major source of drilling troubles and non-productive time (NPT). However, the use of cuttings return system image processing techniques to detect wellbore failure and enlargements in overburden formations and in reservoir sections with no LWD data can serve to fill this gap. Accordingly, systems and methods according to embodiments of the present disclosure may be particularly helpful in downhole sections of a wellbore having no sophisticated LWD tools.

While the present disclosure has been described with respect to a limited number of embodiments, those skilled in the art, having benefit of this disclosure, will appreciate that other embodiments may be devised which do not depart from the scope of the disclosure as described herein. Accordingly, the scope of the disclosure should be limited only by the attached claims.

What is claimed is:

1. A method, comprising:
taking at least one image of a plurality of returned rock fragments from a wellbore using a camera;
analyzing the at least one image with an image analysis program to detect a caving in the plurality of returned rock fragments;
constructing a model of the caving; and
incorporating the model of the caving into a finite element geomechanics model of the wellbore using a meshing program to create an adjusted model of the wellbore,
wherein the finite element geomechanics model of the wellbore comprises a mesh model of the wellbore,
wherein incorporating comprises:
deriving at least one dimension of the caving from the model of the caving;
removing the at least one dimension of the caving from the mesh model of the wellbore to create an adjusted mesh model of the wellbore; and
executing a finite element geomechanics model program on the adjusted mesh model to create the adjusted model of the wellbore, and
wherein the method enables detection of a wellbore failure in an overburden formation or a reservoir section lacking sufficient logging-while-drilling (LWD) data.

2. The method of claim 1, further comprising using the adjusted model of the wellbore to determine drilling window limits for the wellbore, wherein the drilling window limits comprise at least one of a mud weight range and a downhole pressure range to use in the wellbore.

3. The method of claim 1, further comprising generating the finite element geomechanics model of the wellbore, the generating comprising:
performing a pre-processing procedure, comprising:
creating an initial mesh of an initial wellbore model, the initial mesh comprising a plurality of elemental units connected by a plurality of nodes;
assigning loads to the initial wellbore model; and
assigning material properties to the initial wellbore model;
inputting outputs from the pre-processing procedure into a finite element geomechanics model program to generate the finite element geomechanics model of the wellbore.

4. The method of claim 1, wherein the image analysis program comprises an image segmentation program, wherein the analyzing comprises:
locating boundaries of objects in the at least one image to identify the objects;
determining at least one dimension of the objects; and
identifying the caving based on the at least one dimension.

5. The method of claim 1, wherein the at least one image comprises multiple images taken sequentially as the plurality of returned rock fragments are moved across a frame of the camera, and wherein constructing the model of the caving comprises:
tracking the caving at different locations in the frame as the caving moves across the frame in the multiple images;
determining dimensions of the caving from different angles in the different locations in the frame; and
using the dimensions to construct a three-dimensional model of the caving.

6. The method of claim 1, wherein the image analysis program comprises a deep-learning program, wherein the analyzing comprises:
manually identifying bounding box coordinates surrounding cavings in a training set of images labeled with the cavings, wherein the training set of images are taken from the at least one image;
training the deep-learning program using the training set of images labeled with cavings; and
after training, using the deep-learning program to identify the caving.

7. The method of claim 1, wherein the analyzing the at least one image further comprises identifying a mode of failure of the caving, and wherein the method further comprises:
using the mode of failure to determine a structural state of the wellbore; and
incorporating the structural state of the wellbore into the finite element geomechanics model of the wellbore.

8. The method of claim 3, further comprising using the finite element geomechanics model program to:
apply a system of equations to the plurality of elemental units;
apply loads to the initial wellbore model to construct a global stiffness matrix; and
solve the system of equations.

9. The method of claim 3, wherein the analyzing the at least one image further comprises using the image analysis program to detect at least one characteristic of the caving, wherein the model of the caving includes the at least one characteristic, and wherein incorporating the model of the caving into the finite element geomechanics model of the wellbore comprises incorporating the at least one characteristic into the material properties assigned to the initial wellbore model.

10. The method of claim 3, wherein the analyzing the at least one image further comprises using the image analysis program to identify a rock type of the caving, and wherein generating the finite element geomechanics model of the wellbore further comprises:

retrieving mechanical properties of the rock type from a library of rock properties; and incorporating the mechanical properties into the material properties assigned to the initial wellbore model.

11. The method of claim 4, further comprising using at least one algorithm to classify the objects having the at least one dimension within a first range as cuttings and the objects having the at least one dimension within a different range as cavings.

12. A method, comprising:

directing drilling fluid returning from a wellbore to a separator;

separating rock fragments from the drilling fluid in the separator;

continuously taking images of the rock fragments separated from the drilling fluid;

sending the images to a computing system;

identifying and characterizing at least one caving from the images using an image analysis program;

using characteristics of the at least one caving identified from the image analysis program to construct a finite element geomechanics model of the wellbore; and adjusting at least one drilling parameter based on the finite element geomechanics model of the wellbore, wherein the method enables detection of a wellbore failure in an overburden formation or a reservoir section lacking sufficient logging-while-drilling (LWD) data.

13. The method of claim 12, wherein the adjusting the at least one drilling parameter comprises altering an amount of additives to the drilling fluid to change a mud weight in the wellbore.

14. The method of claim 12, further comprising continuously updating the finite element geomechanics model of the wellbore each time one of the at least one caving is identified and characterized.

15. The method of claim 12, wherein identifying and characterizing the at least one caving comprises:

using a conversion scale that maps pixels in the images to dimensions, wherein the conversion scale defines survey points at an interval of a number of pixels along a selected dimension, and wherein a total amount of the survey points is used to measure the selected dimension; and using the measured selected dimension to identify the at least one caving.

16. A system, comprising:

a well system comprising a wellbore extending into a formation;

a cuttings return system, comprising:

a separator fluidly connected to a return line from the wellbore;

a camera positioned proximate the separator; and a computing system in communication with the camera, the computing system comprising:

an image analysis program comprising instructions for identifying a caving from an image produced by the camera;

a finite element geomechanics model program comprising instructions for generating a finite element geomechanics model of the wellbore; and a meshing program comprising instructions to:

derive at least one dimension of the caving from the image; and remove the at least one dimension of the caving from the finite element geomechanics model of the wellbore to create an adjusted model of the wellbore, wherein the system enables detection of a wellbore failure in an overburden formation or a reservoir section lacking sufficient logging-while-drilling (LWD) data.

17. The system of claim 16, wherein the finite element geomechanics model program further comprises:

a pre-processing program comprising instructions for:

creating an initial mesh of an initial wellbore model, the initial mesh comprising a plurality of elemental units connected by a plurality of nodes;

assigning loads to the initial wellbore model; and assigning material properties to the initial wellbore model; and a modeling code comprising instructions for:

applying loads to the initial wellbore model to construct a global stiffness matrix; and solving a system of equations assigned to the plurality of elemental units to reach a convergence close to or equal to equilibrium, wherein the system of equations comprises a minimization of total potential energy equation.

18. The system of claim 16, further comprising an additive tank, comprising:

at least one drilling fluid additive; and a level indicator;

wherein the level indicator is in communication with the computing system.

19. The system of claim 17, further comprising:

a library of rock properties comprising mechanical properties of different rock types;

wherein the library of rock properties is digitally stored; and wherein the finite element geomechanics model program further comprises instructions for:

retrieving the mechanical properties of at least one of the different rock types; and inputting the mechanical properties into the assigned material properties of the initial wellbore model.

* * * * *